US010483617B2

(12) United States Patent
Chuang et al.

(10) Patent No.: US 10,483,617 B2
(45) Date of Patent: Nov. 19, 2019

(54) PACKAGE STRUCTURE

(71) Applicant: Taiwan Semiconductor Manufacturing Co., Ltd., Hsinchu (TW)

(72) Inventors: Nan-Chin Chuang, Taipei (TW); Chen-Hua Yu, Hsinchu (TW); Chung-Shi Liu, Hsinchu (TW); Chao-Wen Shih, Hsinchu County (TW); Shou-Zen Chang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/879,456

(22) Filed: Jan. 25, 2018

(65) Prior Publication Data

US 2019/0103652 A1  Apr. 4, 2019

Related U.S. Application Data

(60) Provisional application No. 62/565,107, filed on Sep. 29, 2017.

(51) Int. Cl.
*H01Q 1/22* (2006.01)
*H01L 23/66* (2006.01)
(Continued)

(52) U.S. Cl.
CPC ....... *H01Q 1/2283* (2013.01); *H01L 23/3107* (2013.01); *H01L 23/552* (2013.01); *H01L 23/66* (2013.01); *H01L 24/13* (2013.01); *H01Q 1/526* (2013.01); *H01Q 19/30* (2013.01); *H01Q 21/0087* (2013.01); *H01Q 21/24* (2013.01); *H01L 2223/6616* (2013.01); *H01L 2223/6677* (2013.01); *H01L 2224/02331* (2013.01);
(Continued)

(58) Field of Classification Search
CPC .. H01Q 1/2283; H01Q 21/24; H01Q 21/0087; H01Q 19/30; H01Q 1/526; H01Q 1/22; H01L 23/552; H01L 24/13; H01L 23/66; H01L 23/3107; H01L 23/31
USPC ........................................................ 343/835
See application file for complete search history.

(56) References Cited

U.S. PATENT DOCUMENTS 7,119,745 B2 * 10/2006 Gaucher .................. H01Q 9/26
                                                  343/700 MS
8,278,749 B2 * 10/2012 Lachner .............. H01L 23/3135
                                                      257/693
(Continued)

*Primary Examiner* — Hai V Tran
(74) *Attorney, Agent, or Firm* — JCIPRNET

(57) ABSTRACT

A package structure including an insulating encapsulation, at least one semiconductor die, at least one first antenna and at least one second antenna is provided. The insulating encapsulation includes a first portion, a second portion and a third portion, wherein the second portion is located between the first portion and the third portion. The at least one semiconductor die is encapsulated in the first portion of the insulating encapsulation, and the second portion and the third portion are stacked on the at least one semiconductor die. The at least one first antenna is electrically connected to the at least one semiconductor die and encapsulated in the third portion of the insulating encapsulation. The at least one second antenna is electrically connected to the at least one semiconductor die and encapsulated in the second portion of the insulating encapsulation.

20 Claims, 11 Drawing Sheets

(51) Int. Cl.
*H01L 23/31* (2006.01)
*H01L 23/00* (2006.01)
*H01L 23/552* (2006.01)
*H01Q 21/00* (2006.01)
*H01Q 21/24* (2006.01)
*H01Q 1/52* (2006.01)
*H01Q 19/30* (2006.01)
*H01Q 15/14* (2006.01)
*H01Q 21/28* (2006.01)

(52) U.S. Cl.
CPC ............... *H01L 2224/02379* (2013.01); *H01L 2224/0401* (2013.01); *H01L 2224/05024* (2013.01); *H01L 2224/13023* (2013.01); *H01L 2224/13024* (2013.01); *H01L 2224/18* (2013.01); *H01L 2924/19102* (2013.01); *H01L 2924/3025* (2013.01); *H01Q 15/14* (2013.01); *H01Q 21/28* (2013.01)

(56) References Cited

U.S. PATENT DOCUMENTS

| | | | |
|---|---|---|---|
| 8,451,618 B2 * | 5/2013 | Boeck | H01L 23/49816 361/761 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2019/0096828 A1 * | 3/2019 | Wu | H01L 23/66 |
| 2019/0131690 A1 * | 5/2019 | Lu | H01L 23/28 |
| 2019/0157206 A1 * | 5/2019 | Wang | H01L 23/5384 |

* cited by examiner

PACKAGE STRUCTURE

CROSS-REFERENCE TO RELATED APPLICATION

This application claims the priority benefit of U.S. provisional application Ser. No. 62/565,107, filed on 2017 Sep. 29. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
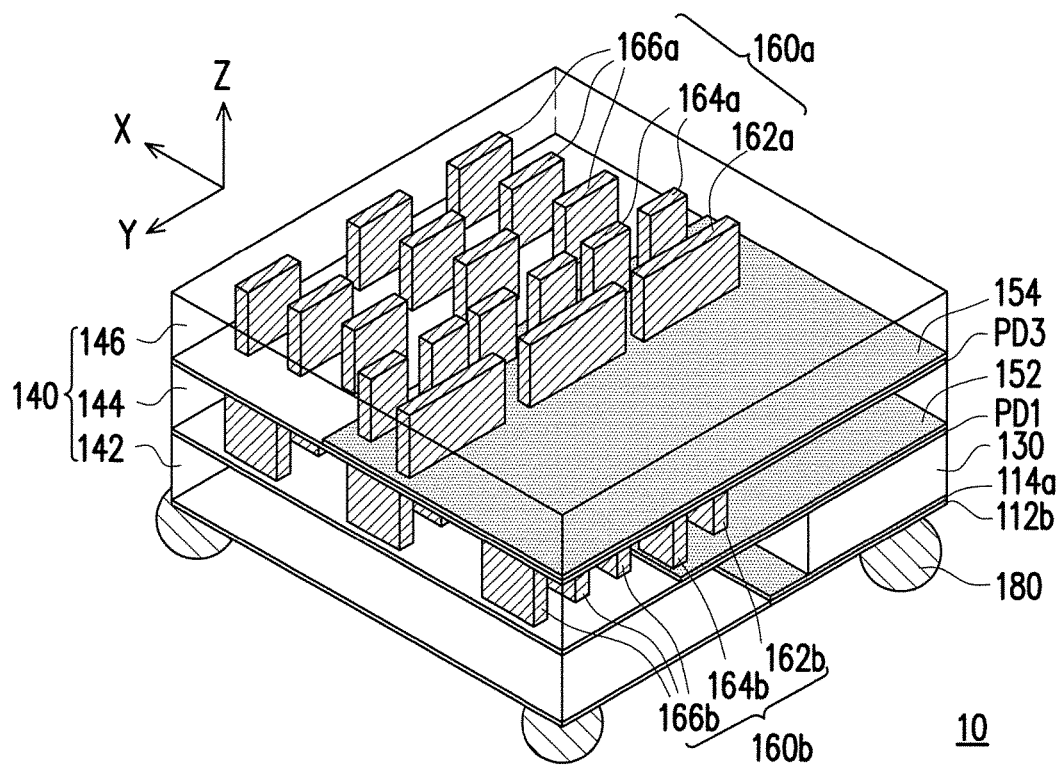
FIG. 1A is a schematic three-dimensional side-view diagram of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," "fifth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
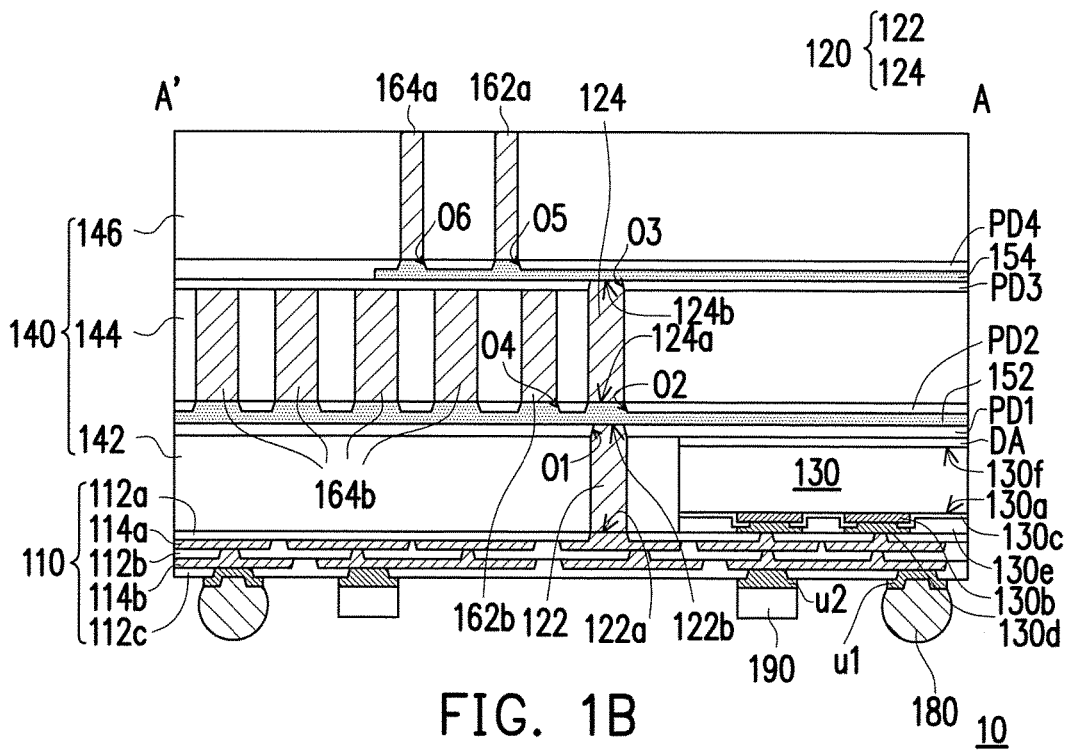
FIG. 1B is a schematic cross-sectional view of the package structure depicted in FIG. 1A.
Figure 1C:
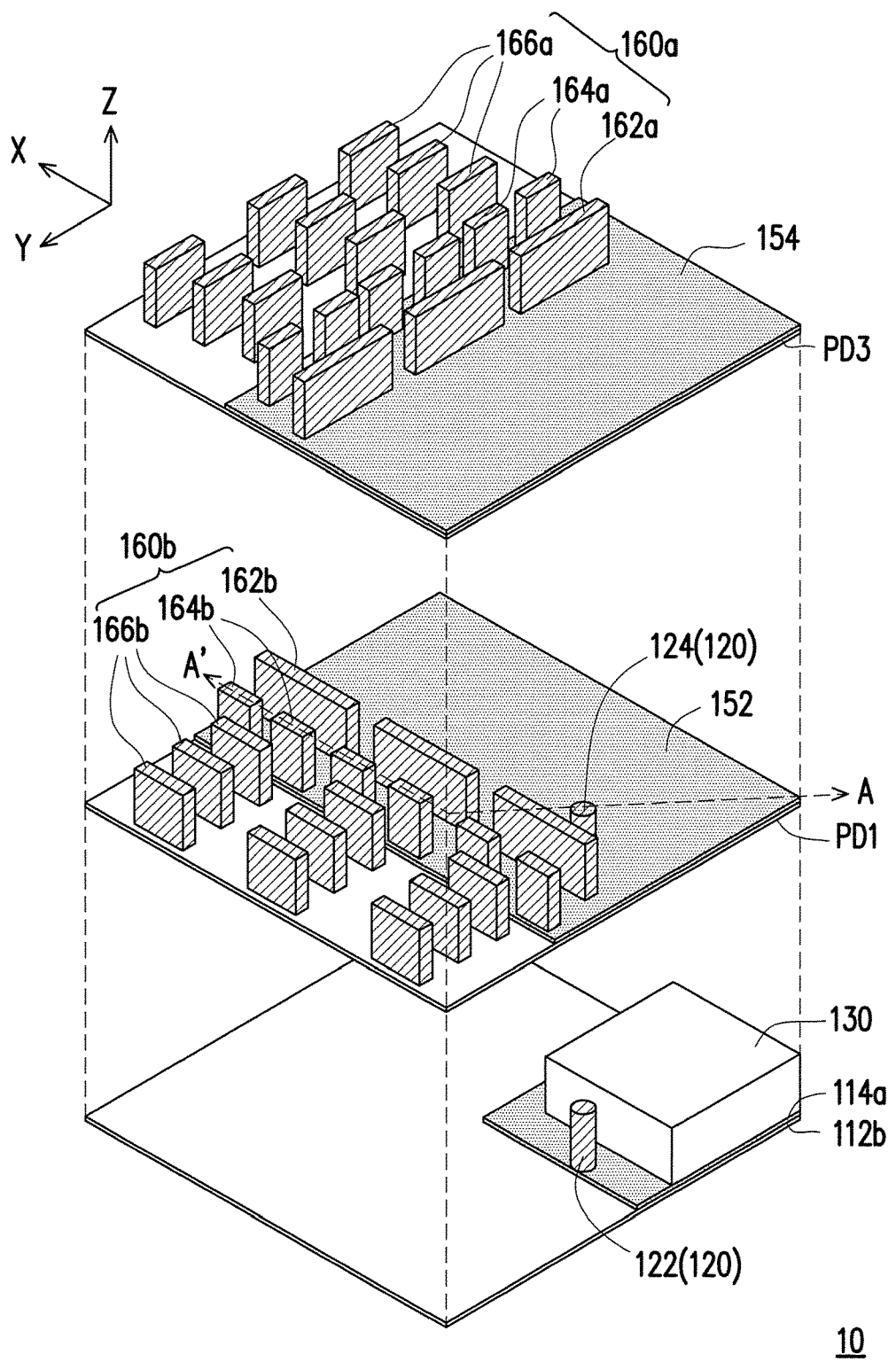
FIG. 1C is a schematic explosive view illustrating the package structure depicted in FIG. 1A.

FIG. 1A is a schematic three-dimensional side-view diagram of a package structure according to some exemplary embodiments of the present disclosure. FIG. 1B is a schematic cross-sectional view of the package structure depicted in FIG. 1A. FIG. 1C is a schematic explosive view illustrating the package structure depicted in FIG. 1A. FIG. 1B is the schematic cross sectional view taken along a section line A-A' depicted in FIG. 1C. Some components shown in FIG. 1B is omitted in FIG. 1A and FIG. 1C to show concise, schematic explosive views. The embodiments are intended to provide further explanations but are not used to limit the scope of the present disclosure. In FIG. 1A to FIG. 1C, only one die, three first antennas and three second antennas are presented for illustrative purposes; however, it should be noted that one or more dies, one or more first antennas, and one or more second antennas may be provided.

Referring to FIG. 1A, FIG. 1B and FIG. 1C, in some embodiments, a package structure 10 includes a redistribution structure 110, at least one through interlayer via (TIV) 120, a semiconductor die 130, an insulating encapsulation 140, a first isolation layer 152, a second isolation layer 154, first antennas 160a, second antennas 160b, and conductive elements 180. As shown in FIG. 1A to FIG. 1C, in some embodiments, the semiconductor die 130, the first antennas 160a, and the second antennas 160b are at different levels and are encapsulated in the insulating encapsulation 140. In some embodiments, from bottom to top (e.g., along a direction Z), the stacking order is, for example, the semiconductor die 130, the second antennas 160b, and the first antennas 160a.

Referring to FIG. 1A and FIG. 1B, in some embodiments, the insulating encapsulation 140 includes a first portion 142, a second portion 144, and a third portion 146, where the second portion 144 is sandwiched between the first portion 142 and the third portion 146. In some embodiments, the semiconductor die 130 is encapsulated in the first portion 142 of the insulating encapsulation 140, the first antennas 160a are encapsulated in the third portion 146 of the insulating encapsulation 140, and the second antennas 160b are encapsulated in the second portion 144 of the insulation encapsulation 140. The insulating encapsulation 140 includes, for example, an epoxy resin, or any other suitable type of encapsulating material, where the disclosure is not limited thereto. Depending on the frequency range of the antenna applications, suitable materials of the insulating encapsulation 140 may be selected based on the required electrical properties of the package structure. In certain embodiments, the materials of the first portion 142, the second portion 144 and the third portion 146 of the insulating encapsulation 140 may be the same. However, in an alternative embodiment, the materials of the first portion 142, the second portion 144 and the third portion 146 of the insulating encapsulation 140 may be different. The disclosure is not limited thereto.

Referring to FIG. 1B, in some embodiments, the semiconductor die 130 includes an active surface 130a, a plurality of pads 130b distributed on the active surface 130a, a passivation layer 130c covering the active surface 130a and a portion of the pad 130b, a plurality of conductive pillars 130d connecting to the pads 130b, a dielectric layer 130e, and a backside surface 130f opposite to the active surface 130a. The pads 130b are partially exposed by the passivation layer 130c, the conductive pillars 130d are disposed on and electrically connected to the pads 130b, and the dielectric layer 130e covers the passivation layer 130c and exposes the conductive pillars 130d. The pads 130b may be aluminum pads or other suitable metal pads, for example. The conductive pillars 130d may be copper pillars, copper alloy pillars or other suitable metal pillars, for example. In some embodiments, the passivation layer 130c and the dielectric layer 130e may be a polybenzoxazole (PBO) layer, a polyimide (PI) layer or other suitable polymer layers. In some alternative embodiments, the passivation layer 130c and the dielectric layer 130e may be made of inorganic materials, such as silicon oxide, silicon nitride, silicon oxynitride, or any suitable dielectric material. The material of the passivation layer 130c can be the same or different from the material of the dielectric layer 130e, for example. In an alternative embodiment, the semiconductor die 130 may include the pads 130b distributed on the active surface 130a, the passivation layer 130c covering the active surface 130a and a portion of the pad 130b, the backside surface 130f opposite to the active surface 130a, where the conductive pillars 130d and the dielectric layer 130e may be omitted. As shown in FIG. 1A to FIG. 1C, only one semiconductor die is presented for illustrative purposes, however, it should be noted that one or more semiconductor dies may be provided. In some embodiments, the semiconductor die 130 described herein may be referred as a chip or an integrated circuit (IC). In certain embodiments, the semiconductor die 130 may further include additional chip(s) of the same type or different types. For example, in an alternative embodiment, more than one semiconductor die 130 is provided, and the semiconductor dies 130, except for including at least one wireless and RF chip, may include the same or different types of chips selected from digital chips, analog chips, mixed signal chips, application-specific integrated circuit ("ASIC") chips, sensor chips, memory chips, logic chips or voltage regulator chips.

Referring to FIG. 1B, in some embodiments, the first isolation layer 152 and the redistribution structure 110 are located at two opposite sides of the semiconductor die 130. The first isolation layer 152 is sandwiched between the first portion 142 of the insulating encapsulation 140 and the second portion 144 of the insulating encapsulation 140. In some embodiments, the first isolation layer 152 is located between a first polymer dielectric layer PD1 and a second polymer dielectric layer PD2. The first polymer dielectric layer PD1, the first isolation layer 152 and the second polymer dielectric layer PD2 are sequentially stacked one over another, and are located between the first portion 142 of the insulating encapsulation 140 and the second portion 144 of the insulating encapsulation 140. In some embodiments, the first polymer dielectric layer PD1 is located between the first isolation layer 152 and the first portion 142 of the insulating encapsulation 140, while the second polymer dielectric layer PD2 is located between the second portion 144 of the insulating encapsulation 140 and the first isolation layer 152. The disclosure is not limited thereto, for example, in one embodiment, the first polymer dielectric layer PD1 may be optionally omitted. In an alternative embodiment, the second polymer dielectric layer PD2 may be optionally omitted. In some embodiments, the material of the first isolation layer 152 may include aluminum, titanium, copper, nickel, tungsten, and/or alloys thereof. In some embodiments, the materials of the first polymer dielectric layer PD1 and the second polymer dielectric layer PD2 may include polyimide, benzocyclobutene (BCB), polybenzooxazole (PBO), or any other suitable polymer-based dielectric material. In one embodiment, the material of the first polymer dielectric layer PD1 may be the same as the material of the second polymer dielectric layer PD2. In an alternative embodiment, the material of the first polymer dielectric layer PD1 may be different from the material of the second polymer dielectric layer PD2.

In certain embodiments, a die attach film DA is provided between the backside surface 130f of the semiconductor die 130 and the first polymer dielectric layer PD1, as shown in FIG. 1B. In some embodiments, due to the die attach film DA provided between the semiconductor die 130 and the first polymer dielectric layer PD1, the semiconductor die 130 is stably adhered to the first polymer dielectric layer PD1.

Referring to FIG. 1B, in some embodiments, the redistribution structure 110 includes one or more metallization layers and one or more polymer-based dielectric layers. As seen in FIG. 1B, the redistribution structure 110 includes a first polymer dielectric material layer 112a, a first metallization layer 114a, a second polymer dielectric material layer 112b, a second metallization layer 114b, and a third polymer dielectric material layer 112c. The first metallization layer 114a is sandwiched between the second polymer dielectric material layer 112b and the first polymer dielectric material layer 112a, and the second metallization layer 114b is sandwiched between the third polymer dielectric material layer 112c and the second polymer dielectric material layer 112b. In certain embodiments, a top surface of the first metallization layers 114a is exposed by the first polymer dielectric material layers 112a, and a bottom surface of the second metallization layers 114b is exposed by the third polymer dielectric material layers 112c.

In some embodiments, the active surface 130a of the semiconductor die 130 faces the redistribution structure 110, and the backside surface 130f of the semiconductor die 130 faces the first isolation layer 152. In one embodiment, the exposed top surface of the first metallization layer 114a is connected to the conductive pillars 130d located on the active surface 130a of the semiconductor die 130 so as to electrically connect the semiconductor die 130 to the redistribution structure 110, and the exposed bottom surface of the second metallization layer 114b is connected to the conductive elements 180. In an alternative embodiment, the exposed bottom surface of the second metallization layer 114b is connected to the conductive elements 180 (e.g., conductive balls, such as solder balls) and semiconductor elements 190 (e.g., passive components or active components according to the product requirements). As shown in FIG. 1B, the redistribution structure 110 is located between the semiconductor die 130 and the conductive elements 180 and between the semiconductor die 130 and semiconductor elements 190.

In some embodiments, the materials of the first metallization layer 114a and the second metallization layer 114b may include aluminum, titanium, copper, nickel, tungsten, and/or alloys thereof. In some embodiments, the materials of the first polymer dielectric material layers 112a, the second polymer dielectric material layers 112b and the third polymer dielectric material layer 112c may include polyimide, benzocyclobutene (BCB), polybenzooxazole (PBO), or any other suitable polymer-based dielectric material. It should be noted that the redistribution structure 110 is not limited to include three polymer dielectric material layers and/or two metallization layers, i.e., the number of dielectric layer(s) and/or metallization layer(s) is not limited to what is disclosed herein according to the present disclosure.

In certain embodiments, a plurality of under-ball metallurgy (UBM) patterns u1, u2 are formed on the exposed bottom surface of the second metallization layers 114b of the redistribution structure 110 for electrically connecting with the conductive elements 180 and/or the semiconductor elements 190, respectively. As shown in FIG. 1B, for example, the under-ball metallurgy patterns u1 are located between the conductive elements 180 and the exposed bottom surface of the second metallization layers 114b, and the under-ball metallurgy patterns u2 are located between the semiconductor elements 190 and the exposed bottom surface of the second metallization layers 114b, however, the disclosure is not limited thereto. Due to the under-ball metallurgy patterns u1 and u2 are formed on the exposed bottom surface of the second metallization layers 114b of the redistribution structure 110, the later-formed conductive elements 180 and/or the semiconductor elements 190 can be accurately located on the under-ball metallurgy patterns u1 and u2 with better fixation, and the ball drop yield and reliability of the package structure 10 are improved. In some embodiments, the under-ball metallurgy patterns u1 and u2 may include copper, nickel, titanium, a combination thereof or the like, and are formed by, e.g., an electroplating process.

Referring to FIG. 1B, in some embodiments, the second isolation layer 154 is sandwiched between the third portion 146 of the insulating encapsulation 140 and the second portion 144 of the insulating encapsulation 140. In some embodiments, the second isolation layer 154 is located between a third polymer dielectric layer PD3 and a fourth polymer dielectric layer PD4. The third polymer dielectric layer PD3, the second isolation layer 154 and the fourth polymer dielectric layer PD4 are sequentially stacked one over another, and are located between the third portion 146 of the insulating encapsulation 140 and the second portion 144 of the insulating encapsulation 140. In some embodiments, the third polymer dielectric layer PD3 is located between the second isolation layer 154 and the second portion 144 of the insulating encapsulation 140, while the fourth polymer dielectric layer PD4 is located between the third portion 146 of the insulating encapsulation 140 and the second isolation layer 154. The disclosure is not limited thereto, for example, in one embodiment, the third polymer dielectric layer PD3 may be optionally omitted. In an alternative embodiment, the fourth polymer dielectric layer PD4 may be optionally omitted. In some embodiments, the material of the second isolation layer 154 may include aluminum, titanium, copper, nickel, tungsten, and/or alloys thereof. In some embodiments, the materials of the third polymer dielectric layer PD3 and the fourth polymer dielectric layer PD4 may include polyimide, benzocyclobutene (BCB), polybenzooxazole (PBO), or any other suitable polymer-based dielectric material. In one embodiment, the material of the third polymer dielectric layer PD3 may be the same as the material of the fourth polymer dielectric layer PD4. In an alternative embodiment, the material of the third polymer dielectric layer PD3 may be different from the material of the fourth polymer dielectric layer PD4.

In certain embodiments, the materials of the first isolation layer 152 and the second isolation layer 154 may be the same or different. In certain embodiments, the materials of the first polymer dielectric layer PD1, the second polymer dielectric layer PD2, the third polymer dielectric layer PD3 and the fourth polymer dielectric layer PD4 may be the same or different. The disclosure is not limited thereto. The first isolation layer 152 and the second isolation layer 154 function as shielding layers of an electric signal or radiating wave to prevent the semiconductor die 130 being affected by either the first antennas 160a or the second antennas 160b and/or to prevent the first antennas 160a or the second antennas 160b being affected by each other or by the semiconductor die 130. Furthermore, in some embodiments, the first isolation layer 152 and the second isolation layer 154 may include isolation layers having patterns, where portions of each of the first isolation layer 152 and the second isolation layer 154 are electrically connected to the semiconductor die 130 and serve as signal patterns, and other portions of each of the first isolation layer 152 and the second isolation layer 154 are electrically isolated to the semiconductor die 130 and serve as antenna ground.

Referring to FIG. 1B, in some embodiments, the at least one TIV 120 includes a first TIV 122 and a second TIV 124. In some embodiments, the first TIV 122 and the second TIV 124 may be through integrated fan-out (InFO) vias. For simplification, only one first TIV 122 and one second TIV 124 are presented for illustrative purposes, however, it should be noted that more than two first TIV and/or second TIV may be formed; the disclosure is not limited thereto.

The numbers of the first TIV 122 and the second TIV 124 can be selected based on the demand.

In some embodiments, the first TIV 122 is encapsulated in the first portion 142 of the insulating encapsulation 140. In some embodiments, a first end 122a of the first TIV 122 is connected to the exposed top surface of the first metallization layer 114a of the redistribution structure 110 so as to electrically connect to the semiconductor die 130, and a second end 122b of the first TIV 122 is connected to the first isolation layer 152 exposed by an opening O1 of the first polymer dielectric layer PD1, where the first end 122a is opposite to the second end 122b. In some embodiments, the second TIV 124 is encapsulated in the second portion 144 of the insulating encapsulation 140. In some embodiments, as shown in FIG. 1B, a first end 124a of the second TIV 124 is connected to the first isolation layer 152 exposed by an opening O2 of the second polymer dielectric layer PD2 so as to electrically connect to the first isolation layer 152, and a second end 124b of the second TIV 124 is connected to the second isolation layer 154 exposed by an opening O3 of the third polymer dielectric layer PD3, where the first end 124a is opposite to the second end 124b. In certain embodiments, the first TIV 122 and the second TIV 124 are electrically connected to the redistribution structure 110. As shown in FIG. 1B, the first TIV 122 is electrically connected to the semiconductor die 130 through the redistribution structure 110, and the second TIV 124 is electrically connected to the semiconductor die 130 through the first isolation layer 152, the first TIV 122, and the redistribution structure 110. In one embodiment, the material of the first TIV 122 and the second TIV 124 may include a metal material such as copper or copper alloys, or the like.

Referring to FIG. 1C, in some embodiments, each of the first antennas 160a include a first reflector 162a, a pair of first drivers 164a, and first directors 166a. As shown in FIG. 1B, in some embodiments, the first reflector 162a and the first drivers 164a of each first antenna 160a are respectively connected to the second isolation layer 154 exposed by an opening O5 and an opening O6 of the fourth polymer dielectric layer PD4 so as to electrically connect to the second isolation layer 154. In other words, the first antennas 160a are electrically connected to the semiconductor die 130 through the second isolation layer 154, the second TIV 124, the first isolation layer 152, the first TIV 122, and the redistribution structure 110. In some embodiments, the first antennas 160a generate an electromagnetic wave (such as microwaves) propagating along a first direction X, where the first reflector 162a, the first drivers 164a, and the first directors 166a are sequentially arranged along the first direction X and are separated apart from each other. The first drivers 164a are arranged in parallel along a second direction Y and are located between the first reflector 162a and the first directors 166a along the first direction X, where the first direction X is different from the second direction Y. In other words, as the first reflector 162a and the first drivers 164a are connected to the second isolation layer 154, and the first drivers 164a are located between the first reflector 162a and the first directors 166a along the first direction X (which is a propagating direction of the electromagnetic wave generated by the first antennas 160a), where the first reflectors 162a and the first drivers 164a are overlapped with the second isolation layer 154 along the direction Z. In other words, the first reflectors 162a and the first drivers 164a stand on the second isolation layer 154, for example. In certain embodiments, the first direction X is perpendicular to the second direction Y, as shown in FIG. 1C. In certain embodiments, the direction Z is perpendicular to the first direction X and the second direction Y, as shown in FIG. 1C. In some embodiments, as shown in FIG. 1C, three first directors 166a are included in one first antenna 160a; however, the disclosure is not limited. In an alternative embodiment, the number of the first directors 166a may be one.

Referring to FIG. 1C, in some embodiments, each of the second antennas 160b includes a second reflector 162b, a pair of second drivers 164b, and second directors 166b. As shown in FIG. 1B, in some embodiments, the second reflector 162b and the second drivers 164b of each second antenna 160b are connected to the first isolation layer 152 exposed by an opening O4 of the second polymer dielectric layer PD2 so as to electrically connect to the first isolation layer 152. In other words, the second antennas 160b are electrically connected to the semiconductor die 130 through the first isolation layer 152, the first TIV 122, and the redistribution structure 110. In some embodiments, the second antennas 160b generate an electromagnetic wave (such as microwaves) propagating along the second direction Y, where the second reflector 162b, the second drivers 164b, and the second directors 166b are sequentially arranged along the second direction Y and are separated apart from each other. The second drivers 164b are arranged in parallel along the first direction X and are located between the second reflector 162b and the second directors 166b along the second direction Y. In other words, the second reflector 162b and the second drivers 164b are connected to the first isolation layer 152, and the second drivers 164b are located between the second reflector 162b and the second directors 166b along the second direction Y (which is a propagating direction of the electromagnetic wave generated by the second antennas 160b), where the second reflectors 162b and the second drivers 164b are overlapped with the first isolation layer 152 along the direction Z. In some embodiments, as shown in FIG. 1C, three second directors 166b are included in one second antenna 160b; however, the disclosure is not limited. In an alternative embodiment, the number of the second directors 166b may be one, less than three or more than three.

In some embodiments, the first antennas 160a and the second antennas 160b are configured as Yagi-Uda antennas. In some embodiments, the first antennas 160a and the second antennas 160b may be end-fire antennas or polarized end-fire antennas (such as horizontal polarized end-fire antennas as shown in FIG. 1C or vertical polarized end-fire antennas (not shown)), but the disclosure is not limited thereto. In one embodiment, the first antennas 160a and the second antennas 160b may have the same structure or different structures. Owing to such configuration, the first antennas 160a and the second antennas 160b are capable of generating electromagnetic waves according to electric signals transmitted from the semiconductor die 130 and/or receiving electromagnetic waves to be processed by the semiconductor die 130. In some embodiments, the first antennas 160a and the second antennas 160b may also be employed to receive electromagnetic waves. That is to say, the first antennas 160a and the second antennas 160b may be configured to generate electromagnetic waves in a first time period, and then the first antennas 160a and the second antennas 160b may be re-assigned to be configured to receive electromagnetic waves in a second time period. Owing to the first antennas 160a and the second antennas 160b, a coverage range of the electromagnetic waves generated from the package structure 10 is increased, and thus the efficiency of the antenna application of the package structure 10 is enhanced. In an alternative embodiment, the first antennas 160a may be configured to generate electromagnetic waves while the second antenna 160b may be configured to receive electromagnetic waves, or vice versa.

Figure 2A:
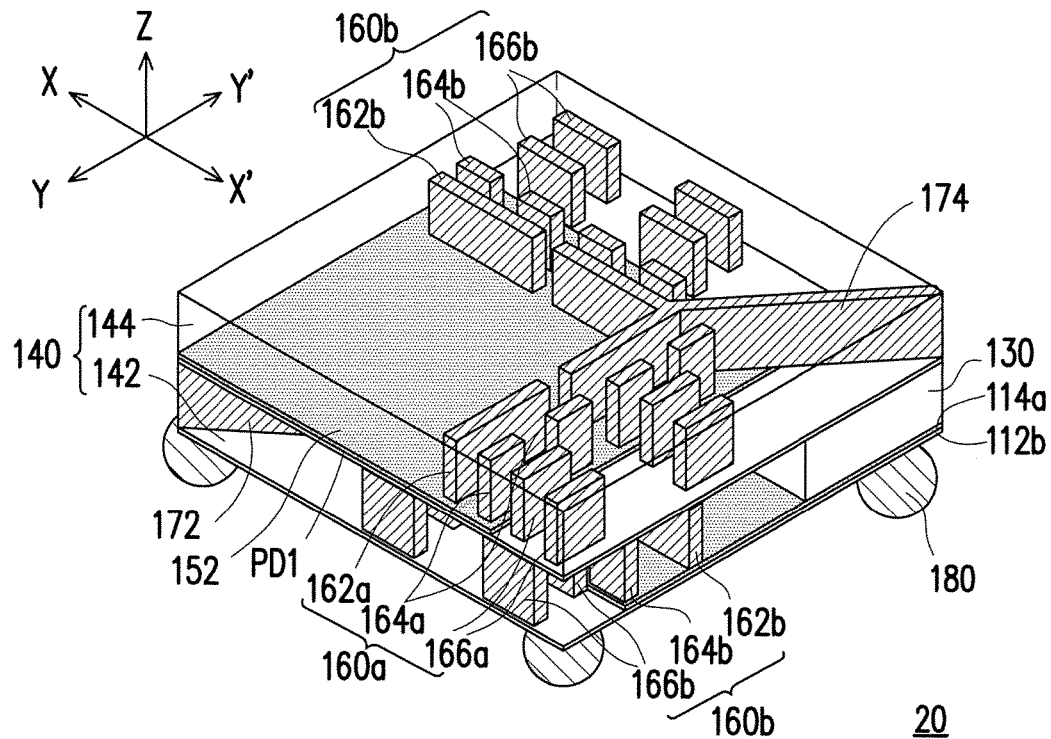
FIG. 2A is a schematic three-dimensional side-view diagram of a package structure according to some exemplary embodiments of the present disclosure.
Figure 2B:
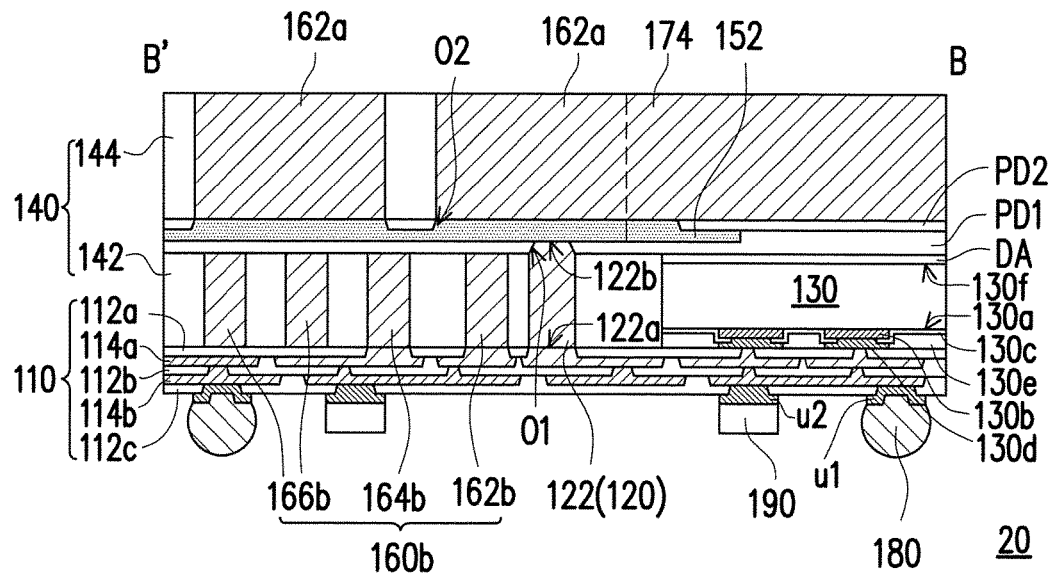
FIG. 2B is a schematic cross-sectional view of the package structure depicted in FIG. 2A.
Figure 2C:
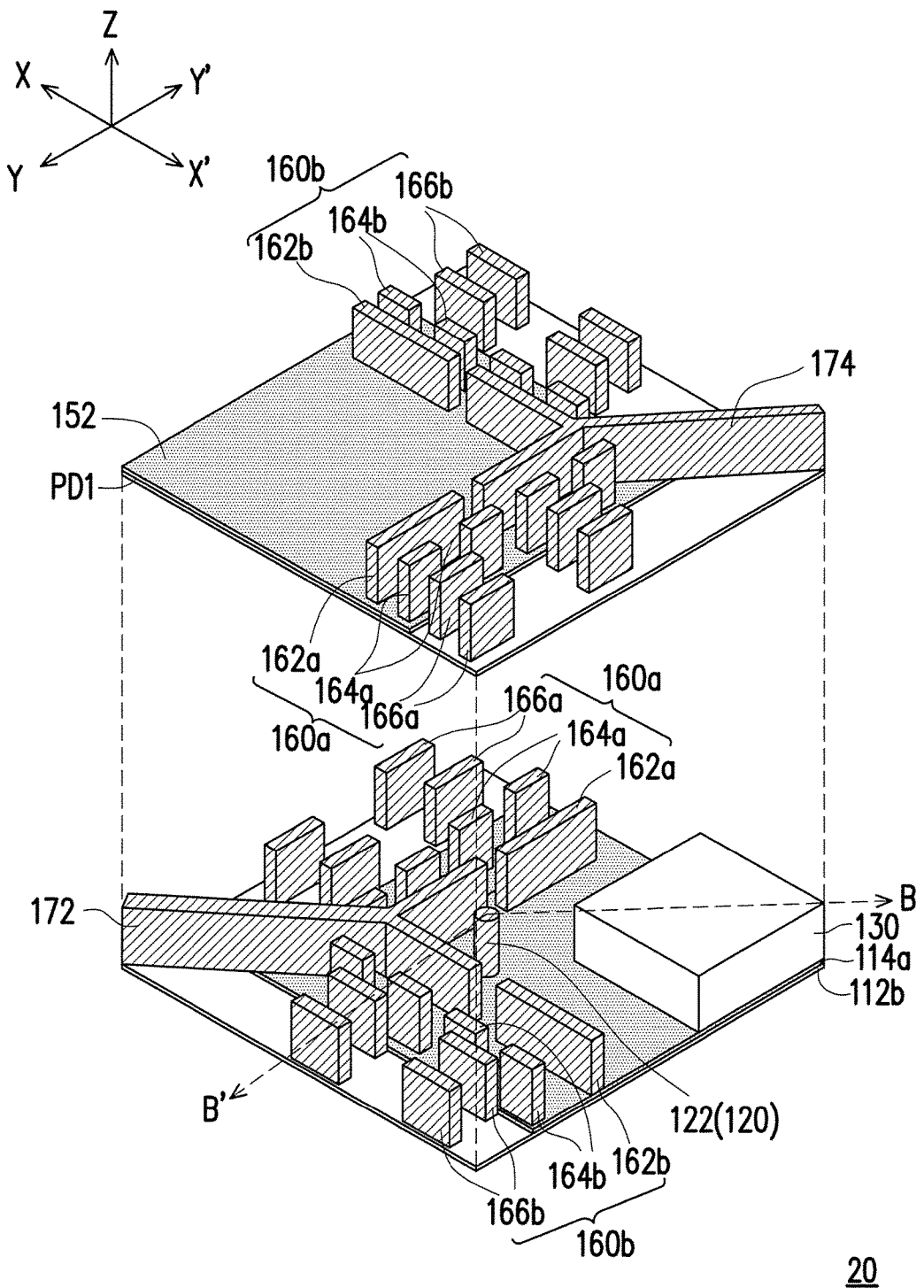
FIG. 2C is a schematic explosive view illustrating the package structure depicted in FIG. 2A.

FIG. 2A is a schematic three-dimensional side-view diagram of a package structure according to some exemplary embodiments of the present disclosure. FIG. 2B is a schematic cross-sectional view of the package structure depicted in FIG. 2A. FIG. 2C is a schematic explosive view illustrating the package structure depicted in FIG. 2A. FIG. 2B is the schematic cross sectional view taken along a section line B-B' depicted in FIG. 2C. Some components shown in FIG. 2B is omitted in FIG. 2A and FIG. 2C to show concise, schematic explosive views. The embodiments are intended to provide further explanations but are not used to limit the scope of the present disclosure. In FIG. 2A to FIG. 2C, only one die, four first antennas and four second antennas are presented for illustrative purposes; however, it should be noted that one or more dies, one or more first antennas, and one or more second antennas may be provided.

Referring to FIG. 1A to FIG. 1C and FIG. 2A to FIG. 2C together, the package structure 10 depicted in FIG. 1A to FIG. 1C and the package structure 20 depicted in FIG. 2A to FIG. 2C has elements similar to or substantially the same, the elements depicted in FIG. 2A to FIG. 2C similar to or substantially the same as the elements described above in FIG. 1A to FIG. 1C will use the same reference numbers, and certain details or descriptions of the same elements will not be repeated herein, for simplicity.

Referring to FIG. 2A, FIG. 2B and FIG. 2C, in some embodiments, a package structure 20 includes a redistribution structure 110, at least one TIV 120, a semiconductor die 130, an insulating encapsulation 140, a first isolation layer 152, first antennas 160a, second antennas 160b, a first through interlayer via (TIV) wall 172, a second TIV wall 174, and conductive elements 180.

Referring to FIG. 2A and FIG. 2B, in some embodiments, the insulating encapsulation 140 includes a first portion 142 and a second portion 144. In some embodiments, the semiconductor die 130, a portion of the first antennas 160a and a portion of the second antennas 160b are encapsulated in the first portion 142 of the insulating encapsulation 140, and another portion of the first antennas 160a and another portion of the second antennas 160b are encapsulated in the second portion 144 of the insulation encapsulation 140.

Referring to FIG. 2B, in some embodiments, the semiconductor die 130 includes an active surface 130a, a plurality of pads 130b distributed on the active surface 130a, a passivation layer 130c covering the active surface 130a and a portion of the pad 130b, a plurality of conductive pillars 130d connecting to the pads 130b, a dielectric layer 130e, and the backside surface 130f opposite to the active surface 130a. The pads 130b are partially exposed by the passivation layer 130c, the conductive pillars 130d are disposed on and electrically connected to the pads 130b, and the dielectric layer 130e covers the passivation layer 130c and exposes the conductive pillars 130d. In an alternative embodiment, the semiconductor die 130 may include the pads 130b distributed on the active surface 130a, the passivation layer 130c covering the active surface 130a and a portion of the pad 130b, the backside surface 130f opposite to the active surface 130a, where the conductive pillars 130d and the dielectric layer 130e may be omitted. As shown in FIG. 2A to FIG. 2C, only one semiconductor die is presented for illustrative purposes, however, it should be noted that one or more semiconductor dies may be provided.

Referring to FIG. 2B, in some embodiments, the first isolation layer 152 and the redistribution structure 110 are located at two opposite sides of the semiconductor die 130. The first isolation layer 152 is sandwiched between the first portion 142 of the insulating encapsulation 140 and the second portion 144 of the insulating encapsulation 140. In some embodiments, the first isolation layer 152 is located between a first polymer dielectric layer PD1 and a second polymer dielectric layer PD2. The first polymer dielectric layer PD1, the first isolation layer 152 and the second polymer dielectric layer PD2 are sequentially stacked one over another, and are located between the first portion 142 of the insulating encapsulation 140 and the second portion 144 of the insulating encapsulation 140. In some embodiments, the first polymer dielectric layer PD1 is located between the first isolation layer 152 and the first portion 142 of the insulating encapsulation 140, while the second polymer dielectric layer PD2 is located between the second portion 144 of the insulating encapsulation 140 and the first isolation layer 152. The disclosure is not limited thereto, for example, in one embodiment, the first polymer dielectric layer PD1 may be optionally omitted. In an alternative embodiment, the second polymer dielectric layer PD2 may be optionally omitted. The first isolation layer 152 functions as a shielding layer of an electric signal or radiating wave to prevent the semiconductor die 130 being affected by either the first antennas 160a and/or the second antennas 160b and/or to prevent the first antennas 160a or the second antennas 160b being affected by each other or by the semiconductor die 130. Furthermore, in some embodiments, the first isolation layer 152 may include an isolation layer having patterns, where portions of the first isolation layer 152 are electrically connected to the semiconductor die 130 and serve as signal patterns, and other portions of the first isolation layer 152 are electrically isolated to the semiconductor die 130 and serve as antenna ground.

In certain embodiments, a die attach film DA is provided between the backside surface 130f of the semiconductor die 130 and the first polymer dielectric layer PD1, as shown in FIG. 2B. In some embodiments, due to the die attach film DA provided between the semiconductor die 130 and the first polymer dielectric layer PD1, the semiconductor die 130 is stably adhered to the first polymer dielectric layer PD1.

Referring to FIG. 2B, in some embodiments, the redistribution structure 110 includes one or more metallization layers and one or more polymer-based dielectric layers. In some embodiments, the redistribution structure 110 includes a first polymer dielectric material layer 112a, a first metallization layer 114a, a second polymer dielectric material layer 112b, a second metallization layer 114b, and a third polymer dielectric material layer 112c. The first metallization layer 114a is sandwiched between the second polymer dielectric material layer 112b and the first polymer dielectric material layer 112a, and the second metallization layer 114b is sandwiched between the third polymer dielectric material layer 112c and the second polymer dielectric material layer 112b. In certain embodiments, a top surface of the first metallization layers 114a is exposed by the first polymer dielectric material layers 112a, and a bottom surface of the second metallization layers 114b is exposed by the third polymer dielectric material layers 112c. It should be noted that the redistribution structure 110 is not limited to include three polymer dielectric material layers and/or two metallization layers, i.e., the number of dielectric layer(s) and/or metallization layer(s) is not limited to what is disclosed herein according to the present disclosure.

In some embodiments, the exposed top surface of the first metallization layer 114a is connected to the conductive pillars 130d located on the active surface 130a of the semiconductor die 130 so as to electrically connect the semiconductor die 130 to the redistribution structure 110, and the exposed bottom surface of the second metallization layer 114b is connected to the conductive elements 180. In an alternative embodiment, the exposed bottom surface of the second metallization layer 114b is connected to the conductive elements 180 and the semiconductor elements 190. As shown in FIG. 2B, the redistribution structure 110 is located between the semiconductor die 130 and the conductive elements 180, and between the semiconductor die 130 and the semiconductor elements 190.

In certain embodiments, a plurality of under-ball metallurgy (UBM) patterns u1, u2 is formed on the exposed bottom surface of the second metallization layers 114b of the redistribution structure 110 for electrically connecting with the conductive elements 180 and/or the semiconductor elements 190, respectively. As shown in FIG. 2B, for example, the under-ball metallurgy patterns u1 are located between the conductive elements 180 and the exposed bottom surface of the second metallization layers 114b, and the under-ball metallurgy patterns u2 are located between the semiconductor elements 190 and the exposed bottom surface of the second metallization layers 114b, however, the disclosure is not limited thereto. Due to the under-ball metallurgy patterns u1 and u2 are formed on the exposed bottom surface of the second metallization layers 114b of the redistribution structure 110, the later-formed conductive elements 180 and/or the semiconductor elements 190 can be accurately located on the under-ball metallurgy patterns u1 and u2 with better fixation, and the ball drop yield and reliability of the package structure 20 are improved.

Referring to FIG. 2B, in some embodiments, the at least one TIV 120 includes a first TIV 122. In some embodiments, the first TIV 122 is a through integrated fan-out (InFO) via. For simplification, only one first TIV 122 is presented for illustrative purposes, however, it should be noted that more than two first TIV may be formed; the disclosure is not limited thereto. The number of the first TIV 122 can be selected based on the demand.

In some embodiments, the first TIV 122 is encapsulated in the first portion 142 of the insulating encapsulation 140. In some embodiments, a first end 122a of the first TIV 122 is connected to the exposed top surface of the first metallization layer 114a of the redistribution structure 110 so as to electrically connect to the semiconductor die 130, and a second end 122b of the first TIV 122 is connected to the first isolation layer 152 exposed by an opening O1 of the first polymer dielectric layer PD1, where the first end 122a is opposite to the second end 122b. As shown in FIG. 2B, for example, the first TIV 122 is electrically connected to the semiconductor die 130 through the redistribution structure 110.

Referring to FIG. 2C, in some embodiments, each of the first antennas 160a includes a first reflector 162a, a pair of first drivers 164a, and first directors 166a. In some embodiments, the first reflector 162a and the first drivers 164a of each of the first antennas 160a encapsulated in the first portion 142 of the insulating encapsulation 140 are connected to the exposed top surface of the first metallization layer 114a of the redistribution structure 110. In other words, the first antennas 160a encapsulated in the first portion 142 of the insulating encapsulation 140 are electrically connected to the semiconductor die 130 through the redistribution structure 110. In some embodiments, the first reflector 162a and the first drivers 164a of each of the first antennas 160a encapsulated in the second portion 144 of the insulating encapsulation 140 are connected to the first isolation layer 152 exposed by an opening O2 of the second polymer dielectric layer PD2. In other words, the first antennas 160a encapsulated in the second portion 144 of the insulating encapsulation 140 are electrically connected to the semiconductor die 130 through the first isolation layer 152, the first TIV 122, and the redistribution structure 110.

In some embodiments, the first antennas 160a encapsulated in the first portion 142 of the insulating encapsulation 140 generate an electromagnetic wave (such as microwaves) propagating along the first direction X. For the first antennas 160a encapsulated in the first portion 142 of the insulating encapsulation 140, the first reflector 162a, the first drivers 164a, and the first directors 166a of the first antennas 160a encapsulated in the first portion 142 of the insulating encapsulation 140 are sequentially arranged along the first direction X and are separated apart from each other. The first drivers 164a are arranged in parallel along the second direction Y and are located between the first reflector 162a and the first directors 166a along the first direction X. In other words, for each first antenna 160a encapsulated in the first portion 142 of the insulating encapsulation 140, the first reflector 162a and the first drivers 164a are connected to the redistribution structure 110, and the first drivers 164a are located between the first reflector 162a and the first directors 166a along the first direction X (which is a propagating direction of the electromagnetic wave generated by the first antennas 160a encapsulated in the first portion 142 of the insulating encapsulation 140), where the first reflector 162a and the first drivers 164a are overlapped with the redistribution structure 110 along the direction Z. In other words, the first reflectors 162a and the first drivers 164a of the first antennas 160a encapsulated in the first portion 142 stand on the redistribution structure 110, for example.

On the other hand, the first antennas 160a encapsulated in the second portion 144 of the insulating encapsulation 140 generate an electromagnetic wave (such as microwaves) propagating along a direction X', where the direction X' is opposite to the first direction X. The first reflector 162a, the first drivers 164a, and the first directors 166a of the first antennas 160a encapsulated in the second portion 144 of the insulating encapsulation 140 are sequentially arranged along the direction X', and are separated apart from each other. For the first antennas 160a encapsulated in the second portion 144 of the insulating encapsulation 140, the first drivers 164a are arranged in parallel along the second direction Y and are located between the first reflector 162a and the first directors 166a along the direction X'. In other words, for each first antenna 160a encapsulated in the second portion 144 of the insulating encapsulation 140, the first reflector 162a and the first drivers 164a are connected to the first isolation layer 152, and the first drivers 164a are located between the first reflector 162a and the first directors 166a along the direction X' (which is a propagating direction of the electromagnetic wave generated by the first antennas 160a encapsulated in the second portion 144 of the insulating encapsulation 140), where the first reflector 162a and the first drivers 164a are overlapped with the first isolation layer 152 along the direction Z. In other words, the first reflectors 162a and the first drivers 164a of the first antennas 160a encapsulated in the second portion 144 stand on the first isolation layer 152, for example. In some embodiments, as shown in FIGS. 2A and 2C, two first directors 166a are included in one first antenna 160a; however, the disclosure is not limited. In an alternative embodiment, the number of the first directors 166a may be less than two or more than two.

Referring to FIG. 2C, in some embodiments, each of the second antennas 160b includes a second reflector 162b, a pair of second drivers 164b, and second directors 166b. In some embodiments, as shown in FIG. 2B, the second reflector 162b and the second drivers 164b of each of the second antennas 160b encapsulated in the first portion 142 of the insulating encapsulation 140 are connected to the exposed top surface of the first metallization layer 114a of the redistribution structure 110. In other words, the second antennas 160b encapsulated in the first portion 142 of the insulating encapsulation 140 are electrically connected to the semiconductor die 130 through the redistribution structure 110. In some embodiments, the second reflector 162b and the second drivers 164b of each of the second antenna 160b encapsulated in the second portion 144 of the insulating encapsulation 140 are connected to the first isolation layer 152 exposed by an opening (not shown) of the second polymer dielectric layer PD2 so as to electrically connect to the first isolation layer 152. In other words, the second antennas 160b encapsulated in the second portion 144 of the insulating encapsulation 140 are electrically connected to the semiconductor die 130 through the first isolation layer 152, the first TIV 122, and the redistribution structure 110.

In some embodiments, the second antennas 160b encapsulated in the first portion 142 of the insulating encapsulation 140 generate an electromagnetic wave (such as microwaves) propagating along the second direction Y, where the second reflector 162b, the second drivers 164b, and the second directors 166b of the second antennas 160b encapsulated in the first portion 142 of the insulating encapsulation 140 are sequentially arranged along the second direction Y and are separated apart from each other. For the second antennas 160b encapsulated in the first portion 142 of the insulating encapsulation 140, the second drivers 164b are arranged in parallel along the first direction X and are located between the second reflector 162b and the second directors 166b along the second direction Y. In other words, for each second antenna 160b encapsulated in the first portion 142 of the insulating encapsulation 140, the second reflector 162b and the second drivers 164b are connected to the redistribution structure 110, and the second drivers 164b are located between the second reflector 162b and the second directors 166b along the second direction Y (which is a propagating direction of the electromagnetic wave generated by the second antennas 160b encapsulated in the first portion 142 of the insulating encapsulation 140), where the second reflector 162b and the second drivers 164b are overlapped with the redistribution structure 110 along the direction Z. In other words, the second reflector 162b and the second drivers 164b of the second antennas 160b encapsulated in the first portion 142 stand on the redistribution structure 110, for example.

On the other hand, the second antennas 160b encapsulated in the second portion 144 of the insulating encapsulation 140 generate an electromagnetic wave (such as microwaves) propagating along a direction Y', where the direction Y' is opposite to the second direction Y. The second reflector 162b, the second drivers 164b, and the second directors 166b of the second antennas 160b encapsulated in the second portion 144 of the insulating encapsulation 140 are sequentially arranged along the direction Y', and are separated apart from each other. For the second antennas 160b encapsulated in the second portion 144 of the insulating encapsulation 140, the second drivers 164b are arranged in parallel along the first direction X and are located between the second reflector 162b and the second directors 166b along the direction Y'. In other words, for each second antenna 160b encapsulated in the second portion 144 of the insulating encapsulation 140, the second reflector 162b and the second drivers 164b are connected to the first isolation layer 152, and the second drivers 164b are located between the second reflector 162b and the second directors 166b along the direction Y' (which is a propagating direction of the electromagnetic wave generated by the second antennas 160b encapsulated in the second portion 144 of the insulating encapsulation 140), where the second reflector 162b and the second drivers 164b are overlapped with the first isolation layer 152 along the direction Z. In other words, the second reflector 162b and the second drivers 164b of the second antennas 160b encapsulated in the second portion 144 stand on the first isolation layer 152, for example. In some embodiments, as shown in FIGS. 2A and 2C, two second directors 166b are included in one second antenna 160b; however, the disclosure is not limited. In an alternative embodiment, the number of the second directors 166b may be less than two or more than two.

In one embodiment, the first metallization layer 114a and the second metallization layer 114b of the redistribution structure 110 presented immediately below the first directors 166a and/or second directors 166b may be optionally omitted to further prevent the first antennas 160a and/or the second antenna 160b being affected by the redistribution structure 110. The disclosure is not limited thereto.

In some embodiments, the first antennas 160a and the second antennas 160b are configured as Yagi-Uda antennas. In some embodiments, the first antennas 160a and the second antennas 160b may be end-fire antennas or polarized end-fire antennas (such as horizontal polarized end-fire antennas as shown in FIG. 2C or vertical polarized end-fire antennas (not shown)), the disclosure is not limited thereto. In one embodiment, the first antennas 160a and the second antennas 160b may have the same structure or different structures. Due to the configuration of the first antennas 160a and the second antennas 160b as shown in FIG. 2A to FIG. 2C, a coverage range of the electromagnetic waves generated from the package structure 20 is further increased, and thus the efficiency of the antenna application of the package structure 20 is enhanced.

Referring to FIG. 2C, in some embodiments, the first TIV wall 172 is encapsulated in the first portion 142 of the insulating encapsulation 140. In certain embodiments, the first TIV wall 172 is located between the redistribution structure 110 and the first isolation layer 152. The first TIV wall 172 is connected to the first reflector 162a of one of the first antennas 160a encapsulated in the first portion 142 of the insulating encapsulation 140 and the second reflector 162b of one of the second antennas 160b encapsulated in the first portion 142 of the insulating encapsulation 140. In some embodiments, the first TIV wall 172 is connected to the first metallization layer 114a of the redistribution structure 110 as shown in FIG. 2C. In some embodiments, the first antennas 160a encapsulated in the first portion 142 of the insulating encapsulation 140 and the second antennas 160b encapsulated in the first portion 142 of the insulating encapsulation 140 are separated by the first TIV wall 172. Due to the presence of the first TIV wall 172, the interference between the first antennas 160a encapsulated in the first portion 142 of the insulating encapsulation 140 and the second antennas 160b encapsulated in the first portion 142 of the insulating encapsulation 140 is suppressed.

In some embodiments, the second TIV wall 174 is encapsulated in the second portion 144 of the insulating encapsulation 140. In certain embodiments, the second TIV wall 174 is located on the first isolation layer 152. The second TIV wall 174 is connected to the first reflector 162a of one of the first antennas 160a encapsulated in the second portion 144 of the insulating encapsulation 140 and the second reflector 162b of one of the second antennas 160b encapsulated in the second portion 144 of the insulating encapsulation 140. In some embodiments, the second TIV wall 174 is connected to the first isolation layer 152 as shown in FIG. 2B. In one embodiment, the first antennas 160a encapsulated in the second portion 144 of the insulating encapsulation 140 and the second antennas 160b encapsulated in the second portion 144 of the insulating encapsulation 140 are separated by the second TIV wall 174. Due to the presence of the second TIV wall 174, the interference between the first antennas 160a encapsulated in the second portion 144 of the insulating encapsulation 140 and the second antennas 160b encapsulated in the second portion 144 of the insulating encapsulation 140 is suppressed.

Figure 3A:
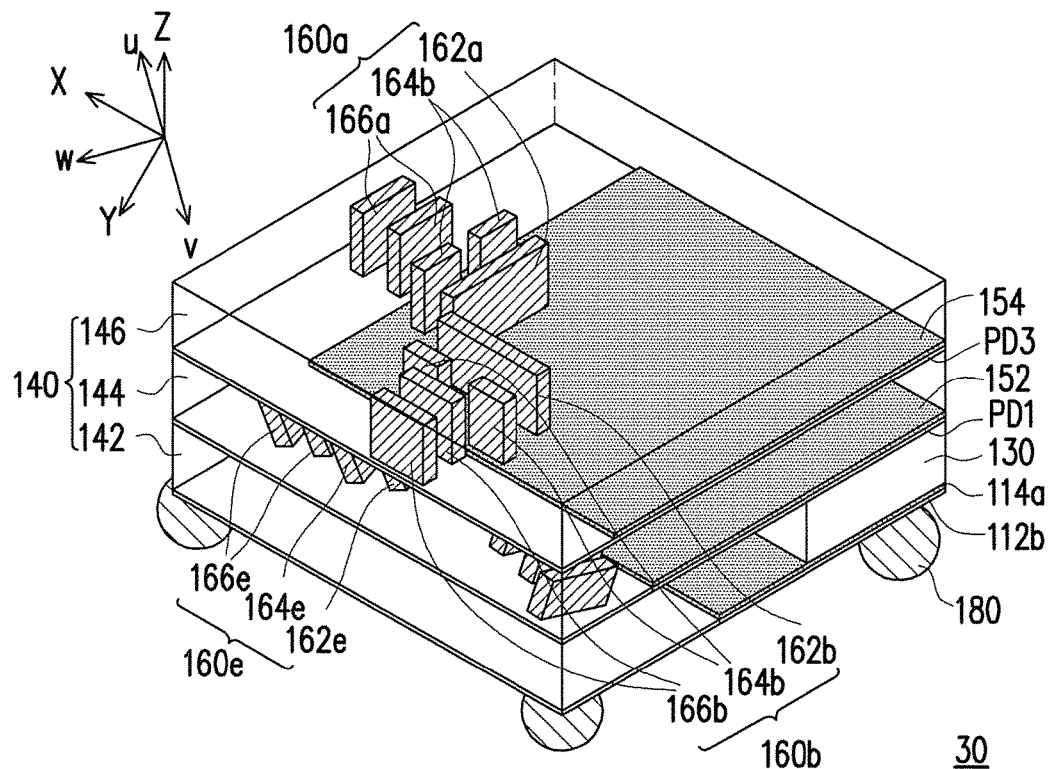
FIG. 3A is a schematic three-dimensional side-view diagram of a package structure according to some exemplary embodiments of the present disclosure.
Figure 3B:
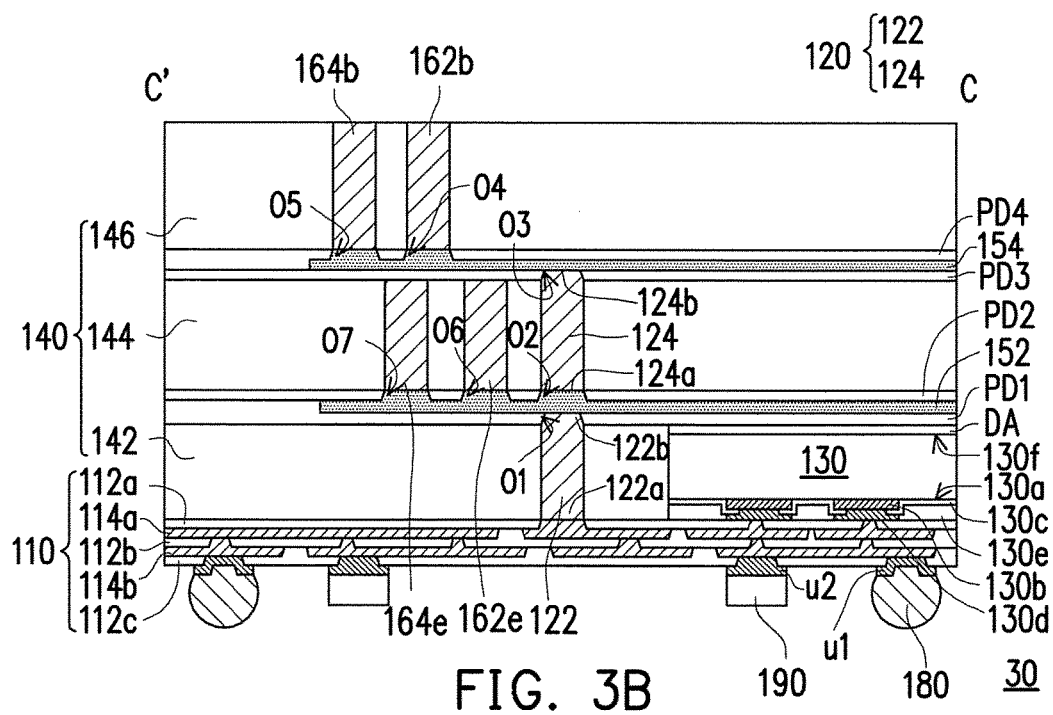
FIG. 3B is a schematic cross-sectional view of the package structure depicted in FIG. 3A.
Figure 3C:
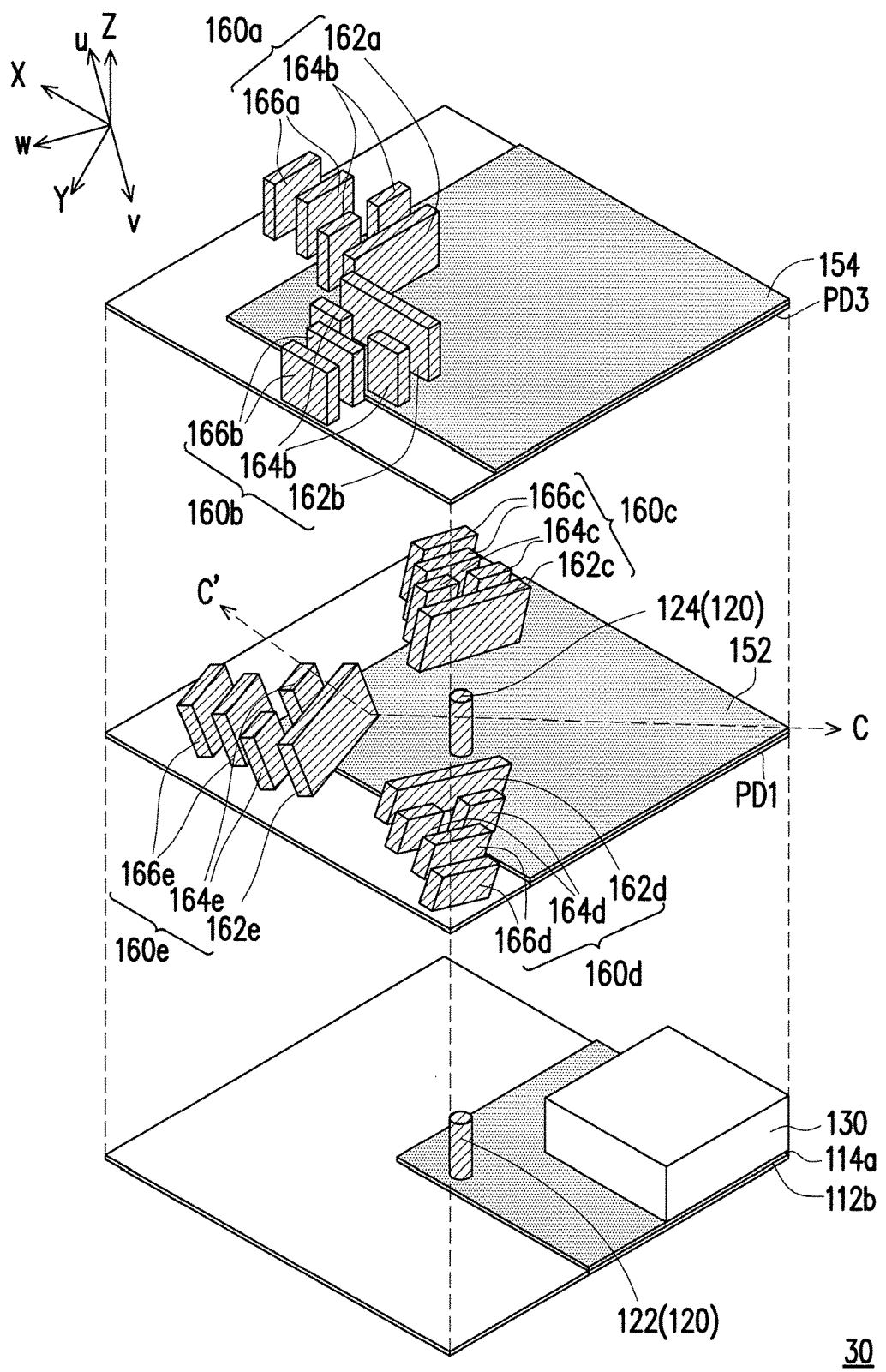
FIG. 3C is a schematic explosive view illustrating the package structure depicted in FIG. 3A.

FIG. 3A is a schematic three-dimensional side-view diagram of a package structure according to some exemplary embodiments of the present disclosure. FIG. 3B is a schematic cross-sectional view of the package structure depicted in FIG. 3A. FIG. 3C is a schematic explosive view illustrating the package structure depicted in FIG. 3A. FIG. 3B is the schematic cross sectional view taken along a section line C-C' depicted in FIG. 3C. Some components shown in FIG. 3B is omitted in FIG. 3A and FIG. 3C to show concise, schematic explosive views. The embodiments are intended to provide further explanations but are not used to limit the scope of the present disclosure. In FIG. 3A to FIG. 3C, only one die, two first antennas, three second antennas are presented for illustrative purposes; however, it should be noted that one or more dies, one or more first antennas, and one or more second antennas may be provided.

Referring to FIG. 1A to FIG. 1C and FIG. 3A to FIG. 3C together, the package structure 10 depicted in FIG. 1A to FIG. 1C and the package structure 30 depicted in FIG. 3A to FIG. 3C has elements similar to or substantially the same, the elements depicted in FIG. 3A to FIG. 3C similar to or substantially the same as the elements described above in FIG. 1A to FIG. 1C will use the same reference numbers, and certain details or descriptions of the same elements will not be repeated herein, for simplicity.

Referring to FIG. 3A, FIG. 3B and FIG. 3C, in some embodiments, a package structure 30 includes a redistribution structure 110, at least one TIV 120, a semiconductor die 130, an insulating encapsulation 140, a first isolation layer 152, a second isolation layer 154, first antennas including a first antenna component 160a and a second antenna component 160b, and second antennas including a third antenna component 160c, a fourth antenna component 160d and a fifth antenna component 160e, and conductive elements 180.

Referring to FIG. 3A and FIG. 3B, in some embodiments, the insulating encapsulation 140 includes a first portion 142, a second portion 144, and a third portion 146, where the second portion 144 is sandwiched between the first portion 142 and the third portion 146. In some embodiments, the semiconductor die 130 is encapsulated in the first portion 142 of the insulating encapsulation 140, the first antenna component 160a and the second antenna component 160b are encapsulated in the third portion 146 of the insulating encapsulation 140, and the third antenna component 160c, the fourth antenna component 160d and the fifth antenna component 160e are encapsulated in the second portion 144 of the insulation encapsulation 140.

Referring to FIG. 3B, in some embodiments, the semiconductor die 130 includes an active surface 130a, a plurality of pads 130b distributed on the active surface 130a, a passivation layer 130c covering the active surface 130a and a portion of the pad 130b, a plurality of conductive pillars 130d connecting to the pads 130b, a dielectric layer 130e, and the backside surface 130f opposite to the active surface 130a. The pads 130b are partially exposed by the passivation layer 130c, the conductive pillars 130d are disposed on and electrically connected to the pads 130b, and the dielectric layer 130e covers the passivation layer 130c and exposes the conductive pillars 130d. In an alternative embodiment, the semiconductor die 130 may include the pads 130b distributed on the active surface 130a, the passivation layer 130c covering the active surface 130a and a portion of the pad 130b, the backside surface 130f opposite to the active surface 130a, where the conductive pillars 130d and the dielectric layer 130e may be omitted. As shown in FIG. 3A to FIG. 3C, only one semiconductor die is presented for illustrative purposes, however, it should be noted that one or more semiconductor dies may be provided.

Referring to FIG. 3B, in some embodiments, the first isolation layer 152 and the redistribution structure 110 are located at two opposite sides of the semiconductor die 130. The first isolation layer 152 is sandwiched between the first portion 142 of the insulating encapsulation 140 and the second portion 144 of the insulating encapsulation 140. In some embodiments, the first isolation layer 152 is located between a first polymer dielectric layer PD1 and a second polymer dielectric layer PD2. The first polymer dielectric layer PD1, the first isolation layer 152 and the second polymer dielectric layer PD2 are sequentially stacked one over another, and are located between the first portion 142 of the insulating encapsulation 140 and the second portion 144 of the insulating encapsulation 140. In some embodiments, the first polymer dielectric layer PD1 is located between the first isolation layer 152 and the first portion 142 of the insulating encapsulation 140, while the second polymer dielectric layer PD2 is located between the second portion 144 of the insulating encapsulation 140 and the first isolation layer 152. The disclosure is not limited thereto, for example, in one embodiment, the first polymer dielectric layer PD1 may be optionally omitted. In an alternative embodiment, the second polymer dielectric layer PD2 may be optionally omitted.

In certain embodiments, a die attach film DA is provided between the backside surface 130f of the semiconductor die 130 and the first polymer dielectric layer PD1, as shown in FIG. 3B. In some embodiments, due to the die attach film DA provided between the semiconductor die 130 and the first polymer dielectric layer PD1, the semiconductor die 130 is stably adhered to the first polymer dielectric layer PD1.

Referring to FIG. 3B, in some embodiments, the redistribution structure 110 includes one or more metallization layers and one or more polymer-based dielectric layers. As seen in FIG. 3B, the redistribution structure 110 includes a first polymer dielectric material layer 112a, a first metallization layer 114a, a second polymer dielectric material layer 112b, a second metallization layer 114b, and a third polymer dielectric material layer 112c. The first metallization layer 114a is sandwiched between the second polymer dielectric material layer 112b and the first polymer dielectric material layer 112a, and the second metallization layer 114b is sandwiched between the third polymer dielectric material layer 112c and the second polymer dielectric material layer 112b. In certain embodiments, a top surface of the first metallization layers 114a is exposed by the first polymer dielectric material layers 112a, and a bottom surface of the second metallization layers 114b is exposed by the third polymer dielectric material layers 112c. It should be noted that the redistribution structure 110 is not limited to include three polymer dielectric material layers and/or two metallization layers, i.e., the number of dielectric layer(s) and/or metallization layer(s) is not limited to what is disclosed herein according to the present disclosure.

In one embodiment, the exposed top surface of the first metallization layer 114a is connected to the conductive pillars 130d located on the active surface 130a of the semiconductor die 130 so as to electrically connect the semiconductor die 130 to the redistribution structure 110, and the exposed bottom surface of the second metallization layer 114b is connected to the conductive elements 180. In an alternative embodiment, the exposed bottom surface of the second metallization layer 114b is connected to the conductive elements and semiconductor elements 190. As shown in 3B, the redistribution structure 110 is located between the semiconductor die 130 and the conductive elements 180, and between the semiconductor die 130 and the semiconductor elements 190.

In certain embodiments, a plurality of under-ball metallurgy (UBM) patterns u1, u2 is formed on the exposed bottom surface of the second metallization layers 114b of the redistribution structure 110 for electrically connecting with the conductive elements 180 and/or the semiconductor elements 190, respectively. As shown in FIG. 3B, for example, the under-ball metallurgy patterns u1 are located between the conductive elements 180 and the exposed bottom surface of the second metallization layers 114b, and the under-ball metallurgy patterns u2 are located between the semiconductor elements 190 and the exposed bottom surface of the second metallization layers 114b, however, the disclosure is not limited thereto. Due to the under-ball metallurgy patterns u1 and u2 are formed on the exposed bottom surface of the second metallization layers 114b of the redistribution structure 110, the later-formed conductive elements 180 and/or the semiconductor elements 190 can be accurately located on the under-ball metallurgy patterns u1 and u2 with better fixation, and the ball drop yield and reliability of the package structure 30 are improved.

Referring to FIG. 3B, in some embodiments, the second isolation layer 154 is sandwiched between the third portion 146 of the insulating encapsulation 140 and the second portion 144 of the insulating encapsulation 140. In some embodiments, the second isolation layer 154 is located between a third polymer dielectric layer PD3 and a fourth polymer dielectric layer PD4. The third polymer dielectric layer PD3, the second isolation layer 154 and the fourth polymer dielectric layer PD4 are sequentially stacked one over another, and are located between the third portion 146 of the insulating encapsulation 140 and the second portion 144 of the insulating encapsulation 140. In some embodiments, the third polymer dielectric layer PD3 is located between the second isolation layer 154 and the second portion 144 of the insulating encapsulation 140, while the fourth polymer dielectric layer PD4 is located between the third portion 146 of the insulating encapsulation 140 and the second isolation layer 154. The disclosure is not limited thereto, for example, in one embodiment, the third polymer dielectric layer PD3 may be optionally omitted. In an alternative embodiment, the fourth polymer dielectric layer PD4 may be optionally omitted. The first isolation layer 152 and the second isolation layer 154 function as shielding layers of an electric signal or radiating wave to prevent the semiconductor die 130 being affected by either the first antennas or the second antennas and/or to prevent the first antennas or the second antennas being affected by each other or by the semiconductor die 130. Furthermore, in some embodiments, the first isolation layer 152 and the second isolation layer 154 may include isolation layers having patterns, where portions of each of the first isolation layer 152 and the second isolation layer 154 are electrically connected to the semiconductor die 130 and serve as signal patterns, and other portions of each of the first isolation layer 152 and the second isolation layer 154 are electrically isolated to the semiconductor die 130 and serve as antenna ground.

Referring to FIG. 3B, in some embodiments, the at least one TIV 120 includes a first TIV 122 and a second TIV 124. In some embodiments, the first TIV 122 and the second TIV 124 are through integrated fan-out (InFO) vias. For simplification, only one first TIV 122 and one second TIV 124 are presented for illustrative purposes, however, it should be noted that more than two first TIV and/or second TIV may be formed; the disclosure is not limited thereto. The numbers of the first TIV 122 and the second TIV 124 can be selected based on the demand.

In some embodiments, the first TIV 122 is encapsulated in the first portion 142 of the insulating encapsulation 140. In some embodiments, a first end 122a of the first TIV 122 is connected to the exposed top surface of the first metallization layer 114a of the redistribution structure 110 so as to electrically connect to the semiconductor die 130, and a second end 122b of the first TIV 122 is connected to the first isolation layer 152 exposed by an opening O1 of the first polymer dielectric layer PD1, where the first end 122a is opposite to the second end 122b. In some embodiments, the second TIV 124 is encapsulated in the second portion 144 of the insulating encapsulation 140. In some embodiments, as shown in FIG. 3B, a first end 124a of the second TIV 124 is connected to the first isolation layer 152 exposed by an opening O2 of the second polymer dielectric layer PD2 so as to electrically connect to the first isolation layer 152, and a second end 124b of the second TIV 124 is connected to the second isolation layer 154 exposed by an opening O3 of the third polymer dielectric layer PD3, where the first end 124a is opposite to the second end 124b. In certain embodiments, the first TIV 122 and the second TIV 124 are electrically connected to the redistribution structure 110. As shown in FIG. 3B, for example, the first TIV 122 is electrically connected to the semiconductor die 130 through the redistribution structure 110, and the second TIV 124 is electrically connected to the semiconductor die 130 through the first isolation layer 152, the first TIV 122, and the redistribution structure 110.

Referring to FIG. 3C, in some embodiments, the first antennas includes one first antenna component 160a and one second antenna component 160b, and the second antennas include one third antenna component 160c, one fourth antenna component 160d, and one fifth antenna component 160e. The numbers of the first, second, third, fourth and fifth antenna components 160a-160e are not limited to one, the numbers of the first, second, third, fourth and fifth antenna components 160a-160e may be more than one, the disclosure is not limited thereto.

In some embodiments, the first antenna component 160a includes a first reflector 162a, a pair of first drivers 164a, and first directors 166a. In some embodiments, the first reflector 162a and the first drivers 164a of the first antenna component 160a are respectively connected to the second isolation layer 154 exposed by an opening O4 and an opening O5 of the fourth polymer dielectric layer PD4 so as to electrically connect to the second isolation layer 154. In other words, the first antenna component 160a is electrically connected to the semiconductor die 130 through the second isolation layer 154, the second TIV 124, the first isolation layer 152, the first TIV 122, and the redistribution structure 110. In some embodiments, the first antenna component 160a generates an electromagnetic wave (such as microwaves) propagating along a first direction X, where the first reflector 162a, the first drivers 164a, and the first directors 166a are sequentially arranged along the first direction X and are separated apart from each other. The first drivers 164a are arranged in parallel along a second direction Y and are located between the first reflector 162a and the first directors 166a along the first direction X. In other words, as the first reflector 162a and the first drivers 164a are connected to the second isolation layer 154, and the first drivers 164a are located between the first reflector 162a and the first directors 166a along the first direction X (which is a propagating direction of the electromagnetic wave generated by the first antenna component 160a), where the first reflectors 162a and the first drivers 164a are overlapped with the second isolation layer 154 along the direction Z. In other words, the first reflectors 162a and the first drivers 164a stand on the second isolation layer 154, for example. In some embodiments, as shown in FIG. 3C, two first directors 166a are included in one first antenna component 160a; however, the disclosure is not limited. In an alternative embodiment, the number of the first directors 166a may be less than two or more than two.

In some embodiments, the second antenna component 160b includes a second reflector 162b, a pair of second drivers 164b, and second directors 166b. In some embodiments, the second reflector 162b and the second drivers 164b of the second antenna component 160b are connected to the second isolation layer 154 exposed by an opening (not shown) of the fourth polymer dielectric layer PD4 so as to electrically connect to the second isolation layer 154. In other words, the second antennas 160b are electrically connected to the semiconductor die 130 through the second isolation layer 154, the second TIV 124, the first isolation layer 152, the first TIV 122, and the redistribution structure 110. In some embodiments, the second antenna component 160b generates an electromagnetic wave (such as microwaves) propagating along the second direction Y, where the second reflector 162b, the second drivers 164b, and the second directors 166b are sequentially arranged along the second direction Y and are separated apart from each other. The second drivers 164b are arranged in parallel along the first direction X and are located between the second reflector 162b and the second directors 166b along the second direction Y. In other words, the second reflector 162b and the second drivers 164b are connected to the second isolation layer 154, and the second drivers 164b are located between the second reflector 162b and the second directors 166b along the second direction Y (which is a propagating direction of the electromagnetic wave generated by the second antenna component 160b), where the second reflector 162b and the second drivers 164b are overlapped with the second isolation layer 154 along the direction Z. In other words, the second reflector 162b and the second drivers 164b stand on the second isolation layer 154, for example. In some embodiments, as shown in FIG. 3C, two second directors 166b are included in one second antenna component 160b; however, the disclosure is not limited. In an alternative embodiment, the number of the second directors 166b may be less than two or more than two.

In some embodiments, the third antenna component 160c includes a third reflector 162c, a pair of third drivers 164c, and third directors 166c. In some embodiments, the third reflector 162c and the third drivers 164c of the third antenna component 160c are respectively connected to the first isolation layer 152 exposed by openings (not shown) of the second polymer dielectric layer PD2 so as to electrically connect to the first isolation layer 152. In other words, the third antenna component 160c are electrically connected to the semiconductor die 130 through the first isolation layer 152, the first TIV 122, and the redistribution structure 110. In some embodiments, the third antenna component 160c generates an electromagnetic wave (such as microwaves) propagating along the third direction U, where the third reflector 162c, the third drivers 164c, and the third directors 166c are sequentially arranged along the third direction U and are separated apart from each other. The third drivers 164c are arranged in parallel along a direction perpendicular to the third direction U, and are located between the third reflector 162c and the third directors 166c along the third direction U. In other words, the third reflector 162c and the third drivers 164c are connected to the first isolation layer 152, and the third drivers 164c are located between the third reflector 162c and the third directors 166c along the third direction U (which is a propagating direction of the electromagnetic wave generated by the third antenna component 160c), where the third reflector 162c and the third drivers 164c are overlapped with the first isolation layer 152 along the direction Z. In other words, the third reflector 162c and the third drivers 164c stand on the first isolation layer 152, for example. In some embodiments, as shown in FIG. 3C, two third directors 166c are included in one third antenna component 160c; however, the disclosure is not limited. In an alternative embodiment, the number of the third directors 166c may be less than two or more than two.

In some embodiments, the fourth antenna component 160d includes a fourth reflector 162d, a pair of fourth drivers 164d, and fourth directors 166d. In some embodiments, the fourth reflector 162d and the fourth drivers 164d of the fourth antenna component 160d are respectively connected to the first isolation layer 152 exposed by openings (not shown) of the second polymer dielectric layer PD2 so as to electrically connect to the first isolation layer 152. In other words, the fourth antenna component 160d are electrically connected to the semiconductor die 130 through the first isolation layer 152, the first TIV 122, and the redistribution structure 110. In some embodiments, the fourth antenna component 160d generates an electromagnetic wave (such as microwaves) propagating along the fourth direction V, where the fourth reflector 162d, the fourth drivers 164d, and the fourth directors 166d are sequentially arranged along the fourth direction V and are separated apart from each other. The fourth drivers 164d are arranged in parallel along a direction perpendicular to the fourth direction V, and are located between the fourth reflector 162d and the fourth directors 166d along the fourth direction V. In other words, the fourth reflector 162d and the fourth drivers 164d are connected to the first isolation layer 152, and the fourth drivers 164d are located between the fourth reflector 162d and the fourth directors 166d along the fourth direction V (which is a propagating direction of the electromagnetic wave generated by the fourth antenna component 160d), where the fourth reflector 162d and the fourth drivers 164d are overlapped with the first isolation layer 152 along the direction Z. In other words, the fourth reflector 162d and the fourth drivers 164d stand on the first isolation layer 152, for example. In some embodiments, as shown in FIG. 3C, two fourth directors 166d are included in one fourth antenna component 160d; however, the disclosure is not limited. In an alternative embodiment, the number of the fourth directors 166d may be less than two or more than two.

In some embodiments, the fifth antenna component 160e includes a fifth reflector 162e, a pair of fifth drivers 164e, and fifth directors 166e. In some embodiments, the fifth reflector 162e and the fifth drivers 164e of the fifth antenna component 160e are respectively connected to the first isolation layer 152 exposed by an opening O6 and an openings O7 of the second polymer dielectric layer PD2 so as to electrically connect to the first isolation layer 152. In other words, the fifth antenna component 160e are electrically connected to the semiconductor die 130 through the first isolation layer 152, the first TIV 122, and the redistribution structure 110. In some embodiments, the fifth antenna component 160e generates an electromagnetic wave (such as microwaves) propagating along the fifth direction W, where the fifth reflector 162e, the fifth drivers 164e, and the fifth directors 166e are sequentially arranged along the fifth direction W and are separated apart from each other. The fifth drivers 164e are arranged in parallel along a direction perpendicular to the fifth direction W, and are located between the fifth reflector 162e and the fifth directors 166e along the fifth direction W. In other words, the fifth reflector 162e and the fifth drivers 164e are connected to the first isolation layer 152, and the fifth drivers 164e are located between the fifth reflector 162e and the fifth directors 166e along the fifth direction W (which is a propagating direction of the electromagnetic wave generated by the fifth antenna component 160e), where the fifth reflector 162e and the fifth drivers 164e are overlapped with the first isolation layer 152 along the direction Z. In other words, the fifth reflector 162e and the fifth drivers 164e stand on the first isolation layer 152, for example. In some embodiments, as shown in FIG. 3C, two fifth directors 166e are included in one fifth antenna component 160e; however, the disclosure is not limited. In an alternative embodiment, the number of the fifth directors 166e may be less than two or more than two.

In some embodiments, as shown in FIGS. 3A and 3C, the third direction U, the fourth direction V, and the fifth direction W are different from the first direction X, the direction X' opposite to the first direction X, the second direction Y, and the direction Y' opposite to the second direction Y. In some embodiments, the first antennas (e.g. the first antenna component 160a and the second antenna component 160b) and the second antennas (e.g. the third antenna component 160c, the fourth antenna component 160d, and the fifth antenna component 160e) are configured as Yagi-Uda antennas. In some embodiments, the first antennas (e.g. the first antenna component 160a and the second antenna component 160b) and the second antennas (e.g. the third antenna component 160c, the fourth antenna component 160d, and the fifth antenna component 160e) may be end-fire antennas or polarized end-fire antennas (such as horizontal polarized end-fire antennas as shown in FIG. 3C or vertical polarized end-fire antennas (not shown)), the disclosure is not limited thereto. In one embodiment, the first antennas (e.g. the first antenna component 160a and the second antenna component 160b) and the second antennas (e.g. the third antenna component 160c, the fourth antenna component 160d, and the fifth antenna component 160e) may be the same or different. Owing to the configuration of the first antenna component 160a, the second antenna component 160b, the third antenna component 160c, the fourth antenna component 160d and the fifth antenna component 160e, a coverage range of the electromagnetic waves generated from the package structure 30 is further increased, and thus the efficiency of the antenna application of the package structure 30 is enhanced.

Figure 4A:
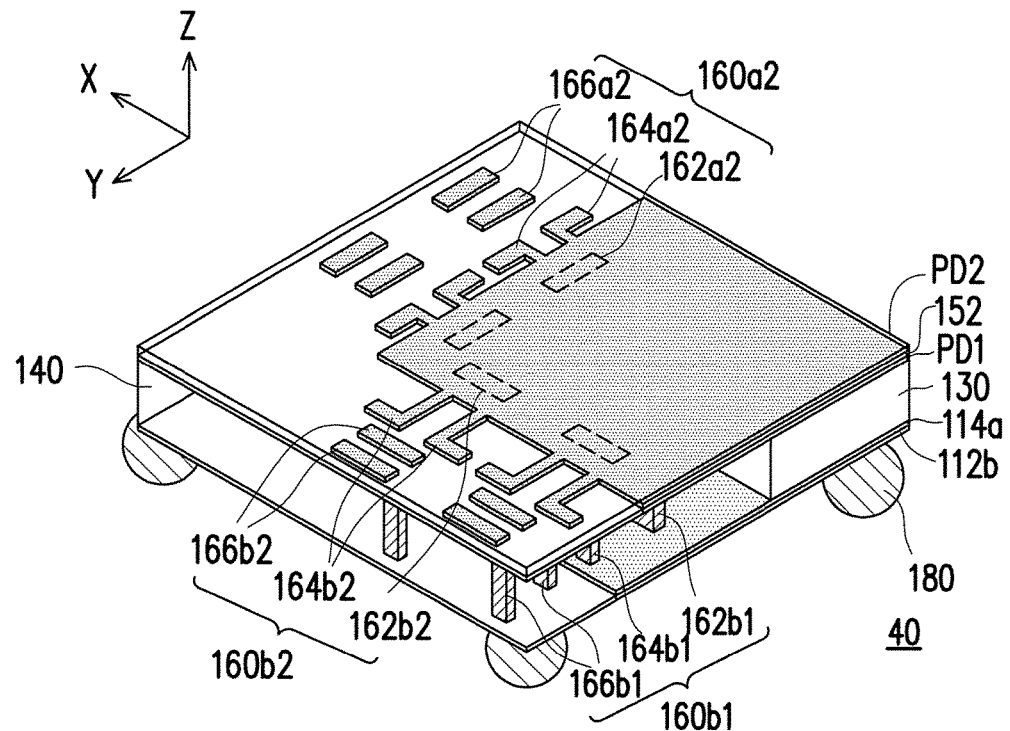
FIG. 4A is a schematic three-dimensional side-view diagram of a package structure according to some exemplary embodiments of the present disclosure.
Figure 4B:
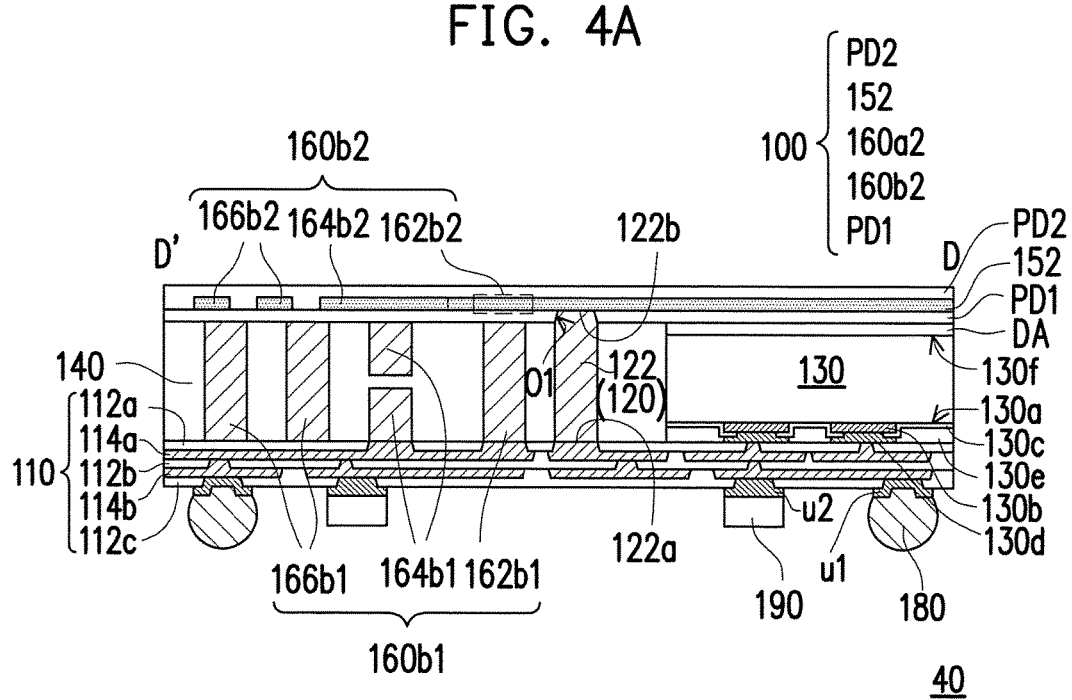
FIG. 4B is a schematic cross-sectional view of the package structure depicted in FIG. 4A.
Figure 4C:
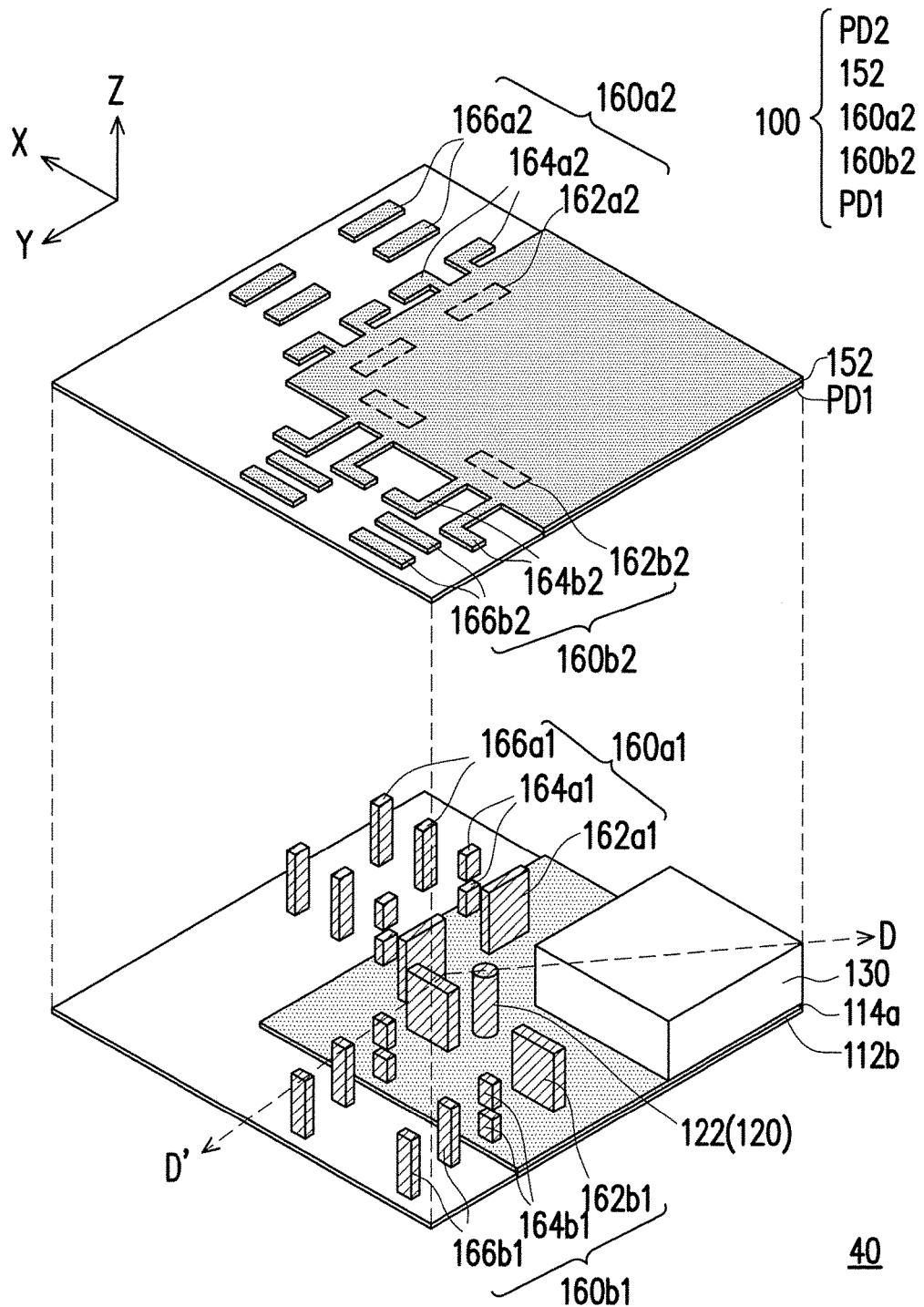
FIG. 4C is a schematic explosive view illustrating the package structure depicted in FIG. 4A.

FIG. 4A is a schematic three-dimensional side-view diagram of a package structure according to some exemplary embodiments of the present disclosure. FIG. 4B is a schematic cross-sectional view of the package structure depicted in FIG. 4A. FIG. 4C is a schematic explosive view illustrating the package structure depicted in FIG. 4A. FIG. 4B is the schematic cross sectional view taken along a section line D-D' depicted in FIG. 4C. Some components shown in FIG. 4B is omitted in FIG. 4A and FIG. 4C to show concise, schematic explosive views. The embodiments are intended to provide further explanations but are not used to limit the scope of the present disclosure. In FIG. 4A to FIG. 4C, only one die, four first antennas and four second antennas are presented for illustrative purposes; however, it should be noted that one or more dies, one or more first antennas, and one or more second antennas may be provided.

Referring to FIG. 1A to FIG. 1C and FIG. 4A to FIG. 4C together, the package structure 10 depicted in FIG. 1A to FIG. 1C and the package structure 40 depicted in FIG. 4A to FIG. 4C has elements similar to or substantially the same, the elements depicted in FIG. 4A to FIG. 4C similar to or substantially the same as the elements described above in FIG. 1A to FIG. 1C will use the same reference numbers, and certain details or descriptions of the same elements will not be repeated herein, for simplicity.

Referring to FIG. 4A, FIG. 4B and FIG. 4C, in some embodiments, a package structure 40 includes a redistribution structure 100, a redistribution structure 110, at least one TIV 120, a semiconductor die 130, an insulating encapsulation 140, first antennas 160a including a first group 160a1 and a second group 160a2, second antennas 160b including a first group 160b1 and a second group 160b2, and conductive elements 180.

Referring to FIG. 4A and FIG. 4B, in some embodiments, the semiconductor die 130, the first group 160a1 of the first antennas 160a and the first group 160b1 of the second antennas 160b are encapsulated in the insulating encapsulation 140, and the second group 160a2 of the first antennas 160a and the second group 160b2 of the second antennas 160b are included in the redistribution structure 100.

Referring to FIG. 4B, in some embodiments, the semiconductor die 130 includes an active surface 130a, a plurality of pads 130b distributed on the active surface 130a, a passivation layer 130c covering the active surface 130a and a portion of the pad 130b, a plurality of conductive pillars 130d connecting to the pads 130b, a dielectric layer 130e, and the backside surface 130f opposite to the active surface 130a. The pads 130b are partially exposed by the passivation layer 130c, the conductive pillars 130d are disposed on and electrically connected to the pads 130b, and the dielectric layer 130e covers the passivation layer 130c and exposes the conductive pillars 130d. In an alternative embodiment, the semiconductor die 130 may include the pads 130b distributed on the active surface 130a, the passivation layer 130c covering the active surface 130a and a portion of the pad 130b, the backside surface 130f opposite to the active surface 130a, where the conductive pillars 130d and the dielectric layer 130e may be omitted. As shown in FIG. 4A to FIG. 4C, only one semiconductor die is presented for illustrative purposes, however, it should be noted that one or more semiconductor dies may be provided.

Referring to FIG. 4B, in some embodiments, the insulating encapsulation 140 is located between the redistribution structure 100 and the redistribution structure 110. In other words, the redistribution structure 100 and the redistribution structure 110 are located at two opposite sides of the semiconductor die 130.

In some embodiments, the redistribution structure 100 includes an isolation layer 152, a first polymer dielectric layer PD1, a second polymer dielectric layer PD2, the second group 160a2 of the first antennas 160a, and the second group 160b2 of the second antennas 160b. In some embodiments, the isolation layer 152 is located between a first polymer dielectric layer PD1 and a second polymer dielectric layer PD2, e.g. the first polymer dielectric layer PD1, the isolation layer 152 and the second polymer dielectric layer PD2 are sequentially stacked one over another. In some embodiments, the second group 160a2 of the first antennas 160a and the second group 160b2 of the second antennas 160b is located between a first polymer dielectric layer PD1 and a second polymer dielectric layer PD2, e.g. the first polymer dielectric layer PD1, the second group 160a2 of the first antennas 160a/the second group 160b2 of the second antennas 160b and the second polymer dielectric layer PD2 are sequentially stacked one over another. In some embodiments, the first polymer dielectric layer PD1 is located between the isolation layer 152 and the insulating encapsulation 140. The disclosure is not limited thereto, for example, in one embodiment, the first polymer dielectric layer PD1 may be optionally omitted. In an alternative embodiment, the second polymer dielectric layer PD2 may be optionally omitted. The isolation layer 152 functions as a shielding layer of an electric signal or radiating wave to prevent the semiconductor die 130 being affected by either the first antennas 160a and/or the second antennas 160b and/or to prevent the first antennas 160a or the second antennas 160b being affected by each other or by the semiconductor die 130. Furthermore, in some embodiments, the first isolation layer 152 may include an isolation layer having patterns, where portions of the first isolation layer 152 are electrically connected to the semiconductor die 130 and serve as signal patterns, and other portions of the first isolation layer 152 are electrically isolated to the semiconductor die 130 and serve as antenna ground.

In certain embodiments, a die attach film DA is provided between the backside surface 130f of the semiconductor die 130 and the first polymer dielectric layer PD1, as shown in FIG. 4B. In some embodiments, due to the die attach film DA provided between the semiconductor die 130 and the first polymer dielectric layer PD1, the semiconductor die 130 is stably adhered to the first polymer dielectric layer PD1.

Referring to FIG. 4B, in some embodiments, the redistribution structure 110 includes one or more metallization layers and one or more polymer-based dielectric layers. In some embodiments, the redistribution structure 110 includes a first polymer dielectric material layer 112a, a first metallization layer 114a, a second polymer dielectric material layer 112b, a second metallization layer 114b, and a third polymer dielectric material layer 112c. The first metallization layer 114a is sandwiched between the second polymer dielectric material layer 112b and the first polymer dielectric material layer 112a, and the second metallization layer 114b is sandwiched between the third polymer dielectric material layer 112c and the second polymer dielectric material layer 112b. In certain embodiments, a top surface of the first metallization layers 114a is exposed by the first polymer dielectric material layers 112a, and a bottom surface of the second metallization layers 114b is exposed by the third polymer dielectric material layers 112c. It should be noted that the redistribution structure 110 is not limited to include three polymer dielectric material layers and/or two metallization layers, i.e., the number of dielectric layer(s) and/or metallization layer(s) is not limited to what is disclosed herein according to the present disclosure.

In some embodiments, the exposed top surface of the first metallization layer 114a is connected to the conductive pillars 130d located on the active surface 130a of the semiconductor die 130 so as to electrically connect the semiconductor die 130 to the redistribution structure 110, and the exposed bottom surface of the second metallization layer 114b is connected to the conductive elements 180. In an alternative embodiment, the exposed bottom surface of the second metallization layer 114b is connected to the conductive elements 180 and the semiconductor elements 190. As shown in FIG. 4B, the redistribution structure 110 is located between the semiconductor die 130 and the conductive elements 180, and between the semiconductor die 130 and the semiconductor elements 190.

In certain embodiments, a plurality of under-ball metallurgy (UBM) patterns u1, u2 is formed on the exposed bottom surface of the second metallization layers 114b of the redistribution structure 110 for electrically connecting with the conductive elements 180 and/or the semiconductor elements 190, respectively. As shown in FIG. 4B, for example, the under-ball metallurgy patterns u1 are located between the conductive elements 180 and the exposed bottom surface of the second metallization layers 114b, and the under-ball metallurgy patterns u2 are located between the semiconductor elements 190 and the exposed bottom surface of the second metallization layers 114b, however, the disclosure is not limited thereto. Due to the under-ball metallurgy patterns u1 and u2 are formed on the exposed bottom surface of the second metallization layers 114b of the redistribution structure 110, the later-formed conductive elements 180 and/or the semiconductor elements 190 can be accurately located on the under-ball metallurgy patterns u1 and u2 with better fixation, and the ball drop yield and reliability of the package structure 40 are improved.

Referring to FIG. 4B, in some embodiments, the at least one TIV 120 includes a first TIV 122. In some embodiments, the first TIV 122 is a through integrated fan-out (InFO) via. For simplification, only one first TIV 122 is presented for illustrative purposes, however, it should be noted that more than two first TIV may be formed; the disclosure is not limited thereto. The number of the first TIV 122 can be selected based on the demand.

In some embodiments, the first TIV 122 is encapsulated in the insulating encapsulation 140. In some embodiments, a first end 122a of the first TIV 122 is connected to the exposed top surface of the first metallization layer 114a of the redistribution structure 110 so as to electrically connect to the semiconductor die 130, and a second end 122b of the first TIV 122 is connected to the isolation layer 152 of the redistribution structure 100 exposed by an opening O1 of the first polymer dielectric layer PD1, where the first end 122a is opposite to the second end 122b. As shown in FIG. 4B, for example, the first TIV 122 is electrically connected to the semiconductor die 130 through the redistribution structure 110. In some embodiments, the isolation layer 152 of the redistribution structure 100 is electrically connected to the semiconductor die 130 through the first TIV 122 and the redistribution structure 110.

Referring to FIG. 4C, in some embodiments, each of the first group 160a1 of the first antennas 160a encapsulated in the insulating encapsulation 140 includes a first reflector 162a1, a pair of first drivers 164a1, and first directors 166a1. In some embodiments, the first reflector 162a1 and the first drivers 164a1 are connected to the exposed top surface of the first metallization layer 114a of the redistribution structure 110. In other words, the first antennas 160a encapsulated in the insulating encapsulation 140 (e.g. the first group 160a1 of the first antennas 160a) are electrically connected to the semiconductor die 130 through the redistribution structure 110. On the other hand, in some embodiments, each of the second group 160a2 of the first antennas 160a included in the redistribution structure 100 includes a first reflector 162a2, a pair of first drivers 164a2, and first directors 166a2. In some embodiments, the first reflector 162a2 and the first drivers 164a2 are connected to the isolation layer 152. In certain embodiments, the first reflector 162a2 is a part of the isolation layer 152, and each of the first drivers 164a2 is in form of a L-shape (see FIG. 4C). In other words, the first antennas 160a included in the redistribution structure 100 (e.g. the second group 160a2 of the first antennas 160a) are electrically connected to the semiconductor die 130 through the isolation layer 152, the first TIV 122, and the redistribution structure 110.

In some embodiments, the first group 160a1 of the first antennas 160a encapsulated in the insulating encapsulation 140 generates an electromagnetic wave (such as microwaves) propagating along the first direction X. For the first group 160a1 of the first antennas 160a encapsulated in the insulating encapsulation 140, the first reflector 162a1, the first drivers 164a1, and the first directors 166a1 are sequentially arranged along the first direction X and are separated apart from each other. The first drivers 164a1 are arranged in parallel along the direction Z, and are located between the first reflector 162a1 and the first directors 166a1 along the first direction X. In other words, for the first group 160a1 of the first antennas 160a encapsulated in the insulating encapsulation 140, the first reflector 162a1 and the first drivers 164a1 are connected to the redistribution structure 110, and the first drivers 164a1 are located between the first reflector 162a1 and the first directors 166a1 along the first direction X (which is a propagating direction of the electromagnetic wave generated by the first antennas 160a encapsulated in the insulating encapsulation 140), where the first reflector 162a1 and the first drivers 164a1 are overlapped with the redistribution structure 110 along the direction Z. In other words, the first reflector 162a1 and the first drivers 164a1 stand on the redistribution structure 110, for example.

In some embodiments, the second group 160a2 of the first antennas 160a included in the redistribution structure 100 generates an electromagnetic wave (such as microwaves) propagating along the first direction X. For the second group 160a2 of the first antennas 160a included in the redistribution structure 100, the first reflector 162a2, the first drivers 164a2, and the first directors 166a2 are sequentially arranged along the first direction X and are separated apart from each other. The first drivers 164a2 are arranged in parallel along the second direction Y, and are located between the first reflector 162a2 and the first directors 166a2 along the first direction X. In other words, for the second group 160a2 of the first antennas 160a included in the redistribution structure 100, the first reflector 162a2 and the first drivers 164a2 are connected to the isolation layer 152, and the first drivers 164a2 are located between the first reflector 162a2 and the first directors 166a2 along the first direction X (which is a propagating direction of the electromagnetic wave generated by the first antennas 160a included in the redistribution structure 100), where the first reflector 162a2 is a part of the isolation layer 152.

In some embodiments, as shown in FIG. 4C, two first directors are included in each of the first antennas 160a; however, the disclosure is not limited. In an alternative embodiment, the number of the first directors may be less than two or more than two. In some embodiments, the first group 160a1 of the first antennas 160a includes vertical polarized antennas (where a maximum size of the first group 160a1 of the first antennas 160a is obtained at the direction Z), while the second group 160a2 of the first antennas 160a includes horizontal polarized antennas (where a maximum size of the second group 160a2 of the first antennas 160a is obtained at the second direction Y), see FIG. 4C.

In some embodiments, the first group 160b1 of the second antennas 160b encapsulated in the insulating encapsulation 140 generates an electromagnetic wave (such as microwaves) propagating along the second direction Y. For the first group 160b1 of the second antennas 160b encapsulated in the insulating encapsulation 140, the second reflector 162b1, the second drivers 164b1, and the second directors 166b1 are sequentially arranged along the second direction Y and are separated apart from each other. The second drivers 164b1 are arranged in parallel along the direction Z, and are located between the second reflector 162b1 and the second directors 166b1 along the second direction Y. In other words, for the first group 160b1 of the second antennas 160b encapsulated in the insulating encapsulation 140, the second reflector 162b1 and the second drivers 164b1 are connected to the redistribution structure 110, and the second drivers 164b1 are located between the second reflector 162b1 and the second directors 166b1 along the second direction Y (which is a propagating direction of the electromagnetic wave generated by the second antennas 160b encapsulated in the insulating encapsulation 140), where the second reflector 162b1 and the second drivers 164b1 are overlapped with the redistribution structure 110 along the direction Z. In other words, the second reflector 162b1 and the second drivers 164b1 stand on the redistribution structure 110, for example.

In some embodiments, the second group 160b2 of the second antennas 160b included in the redistribution structure 100 generates an electromagnetic wave (such as microwaves) propagating along the second direction Y. For the second group 160b2 of the second antennas 160b included in the redistribution structure 100, the second reflector 162b2, the second drivers 164b2, and the second directors 166b2 are sequentially arranged along the second direction Y and are separated apart from each other. The second drivers 164b2 are arranged in parallel along the first direction X, and are located between the second reflector 162b2 and the second directors 166b2 along the second direction Y. In other words, for the second group 160b2 of the second antennas 160b included in the redistribution structure 100, the second reflector 162b2 and the second drivers 164b2 is connected to the isolation layer 152, and the second drivers 164b2 are located between the second reflector 162b2 and the second directors 166b2 along the second direction Y (which is a propagating direction of the electromagnetic wave generated by the second antennas 160b included in the redistribution structure 100), where the second reflector 162b2 is a part of the isolation layer 152.

In one embodiment, the first metallization layer 114a and the second metallization layer 114b of the redistribution structure 110 presented immediately below the first directors 166a and/or second directors 166b may be optionally omitted to further prevent the first antennas 160a and/or the second antenna 160b being affected by the redistribution structure 110. The disclosure is not limited thereto.

In some embodiments, as shown in FIG. 4C, two first directors are included in each of the second antennas 160b; however, the disclosure is not limited. In an alternative embodiment, the number of the first directors may be less than two or more than two. In some embodiments, the first group 160*b*1 of the second antennas 160*b* includes vertical polarized antennas (where a maximum size of the first group 160*b*1 of the second antennas 160*b* is obtained at the direction Z), while the second group 160*b*2 of the second antennas 160*b* includes horizontal polarized antennas (where a maximum size of the second group 160*b*2 of the second antennas 160*b* is obtained at the first direction X), see FIG. 4C. In some embodiments, the first antennas 160*a* and the second antennas 160*b* are configured as Yagi-Uda antennas. In certain embodiments, the first group 160*a*1 of the first antennas 160*a* is considered as vertical polarized Yagi-Uda antennas, and the second group 160*a*2 of the first antennas 160*a* is considered as horizontal polarized Yagi-Uda antennas. That is to say, in certain embodiments, as shown in FIG. 4C, the first group 160*b*1 of the second antennas 160*b* is considered as vertical polarized Yagi-Uda antennas, and the second group 160*b*2 of the second antennas 160*b* is considered as horizontal polarized Yagi-Uda antennas. Owing to the configuration of the first antennas 160*a* (including the first group 160*a*1 and the second group 160*a*2) and the second antennas 160*b* (including the first group 160*b*1 and the second group 160*b*2), a channel capacity of the electromagnetic waves generated from the package structure 40 is increased and the form factor of the package structure 40 is decreased, and thus the efficiency of the antenna application of the package structure 40 is enhanced.

In an alternative embodiment, the pair of the first drivers 164*a*1 of each of the first group 160*a*1 of the first antennas 160*a* encapsulated in the insulating encapsulation 140 may be replaced with a first driver and a dummy first driver (not shown). In certain embodiments, the first driver is connected to the redistribution structure 110 and has a similar dimensional size to the first directors 166*a*1, and the dummy first driver is a part of the first metallization layer 114*a* or the second metallization layer 114*b* of the redistribution structure 110, where the dummy first driver correspondingly has a symmetric mirror pattern of the first driver. In an alternative embodiment, in some embodiments, the pair of the second drivers 164*b*1 of each of the first group 160*b*1 of the second antennas 160*b* encapsulated in the insulating encapsulation 140 may be replaced with a second driver and a dummy second driver (not shown). In certain embodiments, the second driver is connected to the redistribution structure 110 and has a similar dimensional size to the second directors 166*b*1, and the dummy second driver is a part of the first metallization layer 114*a* or the second metallization layer 114*b* of the redistribution structure 110, where the dummy second driver correspondingly has a symmetric mirror pattern of the second driver. The disclosure is not limited thereto.

Figure 5A:
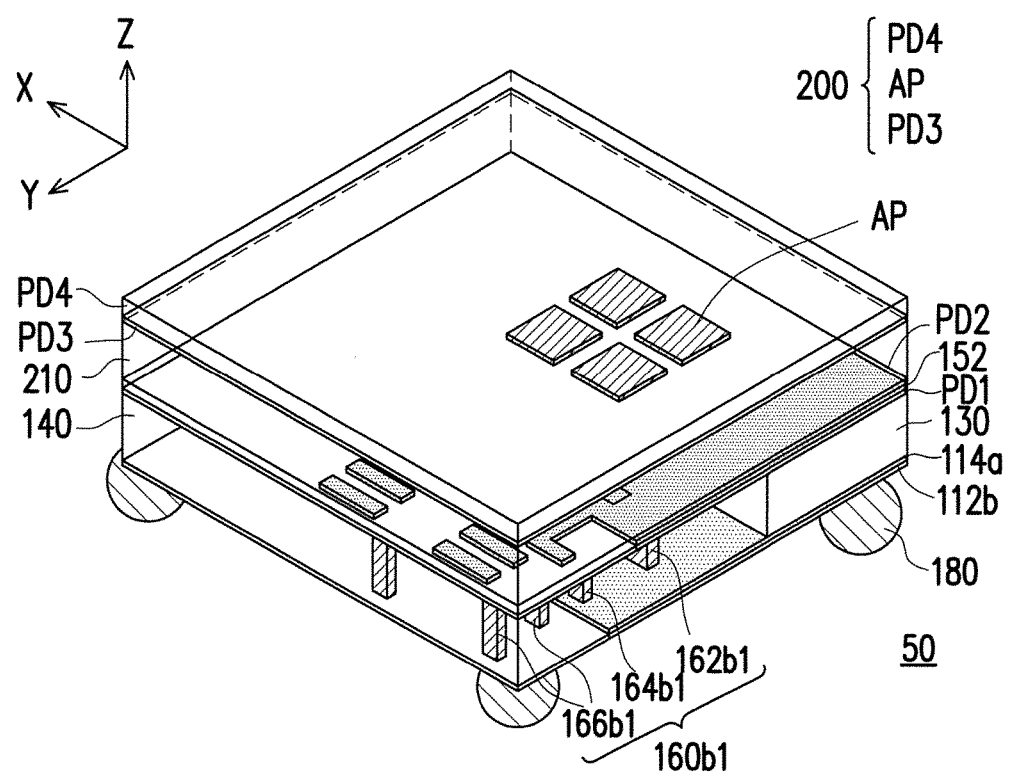
FIG. 5A is a schematic three-dimensional side-view diagram of a package structure according to some exemplary embodiments of the present disclosure.
Figure 5B:
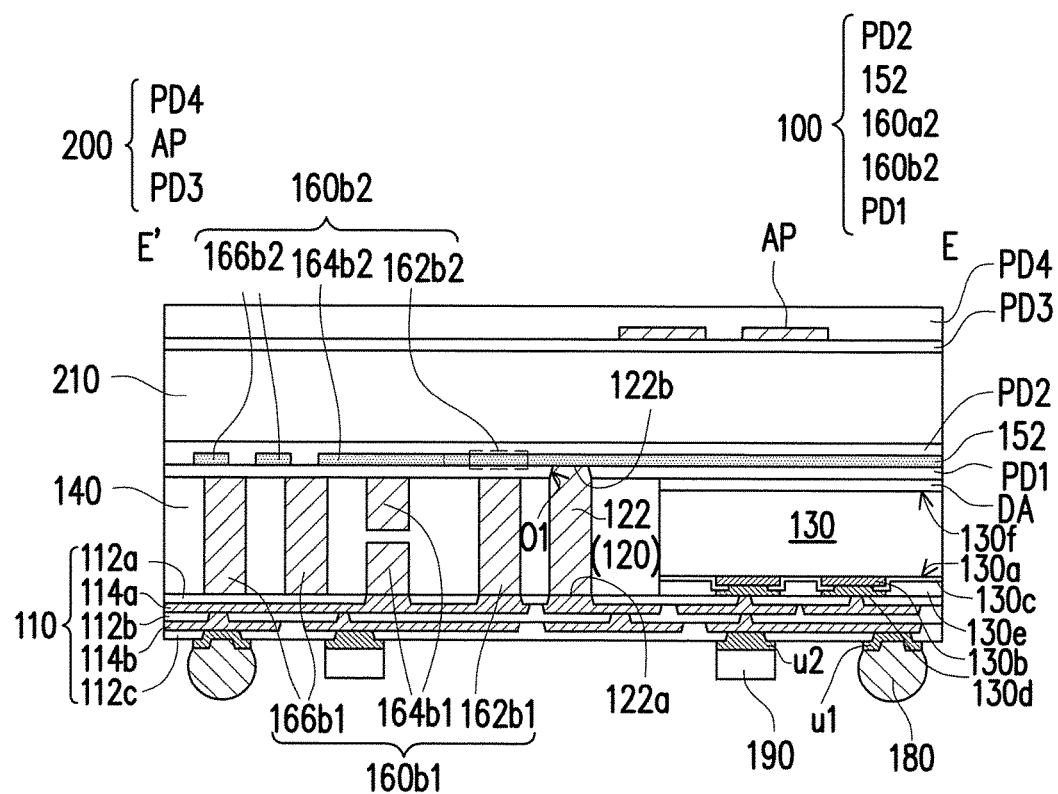
FIG. 5B is a schematic cross-sectional view of the package structure depicted in FIG. 5A.
Figure 5C:
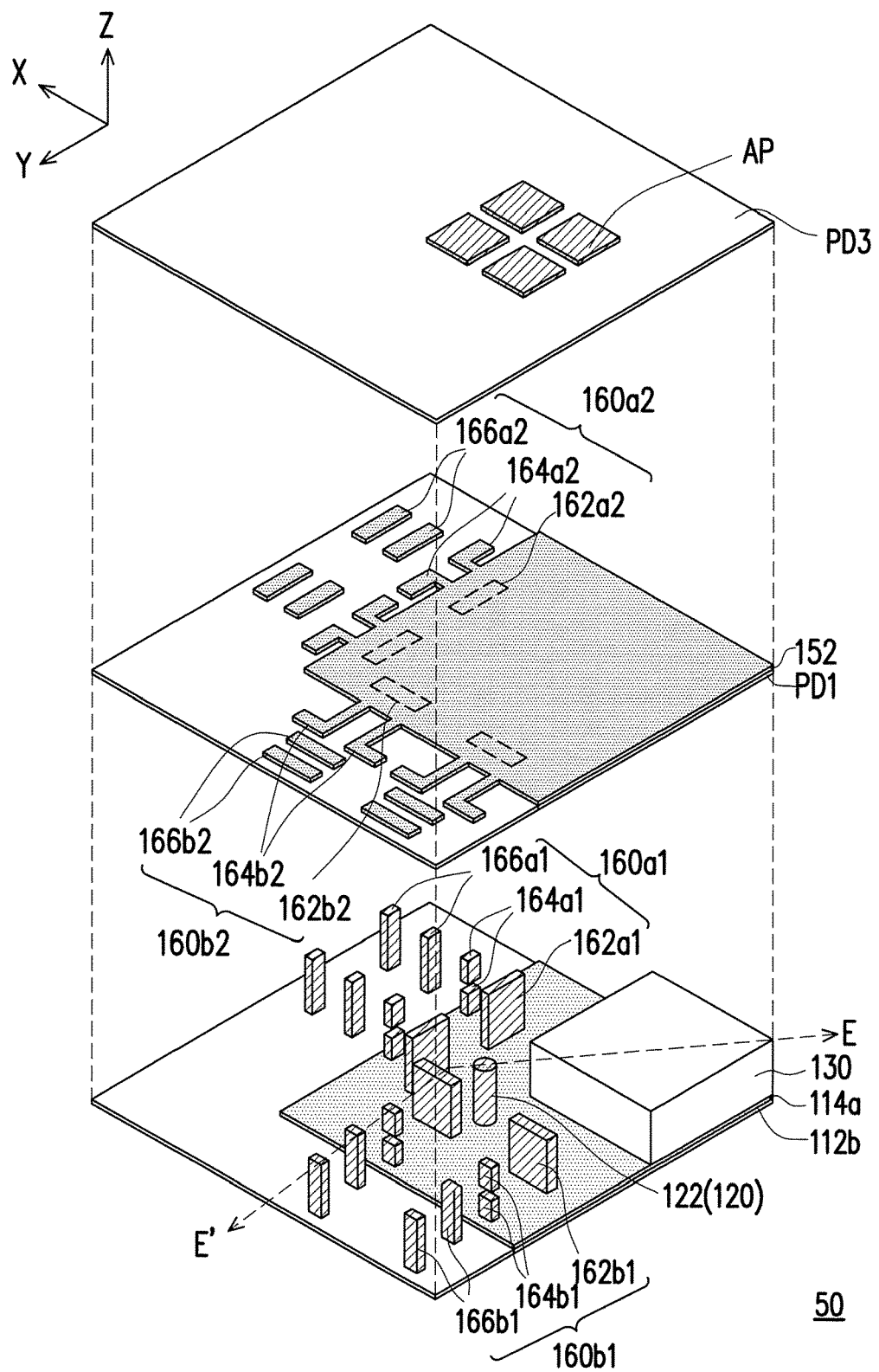
FIG. 5C is a schematic explosive view illustrating the package structure depicted in FIG. 5A.

FIG. 5A is a schematic three-dimensional side-view diagram of a package structure according to some exemplary embodiments of the present disclosure. FIG. 5B is a schematic cross-sectional view of the package structure depicted in FIG. 5A. FIG. 5C is a schematic explosive view illustrating the package structure depicted in FIG. 5A. FIG. 5B is the schematic cross sectional view taken along a section line E-E' depicted in FIG. 5C. Some components shown in FIG. 5B is omitted in FIG. 5A and FIG. 5C to show concise, schematic explosive views. The embodiments are intended to provide further explanations but are not used to limit the scope of the present disclosure. In FIG. 5A to FIG. 5C, only one die, four first antennas and four second antennas are presented for illustrative purposes; however, it should be noted that one or more dies, one or more first antennas, and one or more second antennas may be provided.

Referring to FIG. 4A to FIG. 4C and FIG. 5A to FIG. 5C together, the package structure 40 depicted in FIG. 4A to FIG. 4C and the package structure 50 depicted in FIG. 5A to FIG. 5C is similar, the difference is that, the package structure 50 depicted in FIG. 5A to FIG. 5C further includes a redistribution structure 200 and a dielectric layer 210 located between the redistribution structure 200 and the redistribution structure 100. The elements depicted in FIG. 5A to FIG. 5C similar to or substantially the same as the elements described above in FIG. 4A to FIG. 4C will use the same reference numbers, and certain details or descriptions of the same elements will not be repeated herein, for simplicity.

Referring to FIG. 5A to FIG. 5C, in some embodiments, the redistribution structure 200 is located above the redistribution structure 100 and located on the dielectric layer 210. In some embodiments, the dielectric layer 210 is located between the redistribution structure 200 and the redistribution structure 100. In some embodiments, the redistribution structure 100 is located between the dielectric layer 210 and the insulating encapsulation 140 and between the dielectric layer 210 and the semiconductor die 130. In some embodiments, the dielectric layer 210 may include a molding compound, such as plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combination thereof, the disclosure is not limited thereto.

In some embodiments, the redistribution structure 200 includes antennas AP, a third polymer dielectric layer PD3 and a fourth polymer dielectric layer PD4, where the antennas AP are located between the third polymer dielectric layer PD3 and the fourth polymer dielectric layer PD4. In certain embodiments, the third polymer dielectric layer PD3 is located between the antennas AP and the dielectric layer 210. In some embodiments, the isolation layer 152 is overlapped with the antennas AP, and the antennas AP are electrically coupled with the isolation layer 152. The disclosure is not limited thereto, for example, in one embodiment, the third polymer dielectric layer PD3 may be optionally omitted. In an alternative embodiment, the fourth polymer dielectric layer PD4 may be optionally omitted. The isolation layer 152 overlapped with the antennas AP and electrically isolated from the first TIV 122 serves as a ground plate, and the isolation layer 152 connected to the first TIV 122 serves as a feed-line. In some embodiments, a part of the isolation layer 152 is referred as the ground plate of antennas AP, and another part of the isolation layer 152 is referred as the feed line of antennas AP.

In some embodiments, the material of the antennas AP includes aluminum, titanium, copper, nickel, tungsten, and/or alloys thereof. In certain embodiments, the antennas AP are arranged in form of a matrix, such as the N×N array or N×M arrays (N, M>0, N may or may not be equal to M). In some embodiments, the antennas AP may include patch antennas. Owing to the configuration of the first antennas 160*a* (including the first group 160*a*1 and the second group 160*a*2), the second antennas 160*b* (including the first group 160*b*1 and the second group 160*b*2) and the antennas AP, a coverage range of the electromagnetic waves generated from the package structure 50 is further increased, and thus the efficiency of the antenna application of the package structure 50 is enhanced. As shown in FIG. 5A and FIG. 5C, in some embodiments, the package structure 50 includes the antennas AP arranged in form of an array, such as a 2×2 array, however, the disclosure is not limited thereto. The size of the array for the antennas AP can be designated and selected based on the demand.

According to some embodiments, a package structure includes an insulating encapsulation, at least one semiconductor die, at least one first antenna and at least one second antenna. The insulating encapsulation includes a first portion, a second portion and a third portion, wherein the second portion is located between the first portion and the third portion. The at least one semiconductor die is encapsulated in the first portion of the insulating encapsulation. The at least one first antenna is electrically connected to the at least one semiconductor die and encapsulated in the third portion of the insulating encapsulation. The at least one second antenna is electrically connected to the at least one semiconductor die and encapsulated in the second portion of the insulating encapsulation.

According to some embodiments, a package structure includes an insulating encapsulation, at least one semiconductor die, first antennas, and second antennas. The insulating encapsulation includes a first portion and a second portion stacked on the first portion. The at least one semiconductor die is encapsulated in the first portion of the insulating encapsulation, and the second portion and the third portion are stacked on the at least one semiconductor die. The first antennas are electrically connected to the at least one semiconductor die, wherein a portion of the first antenna is encapsulated in the first portion of the insulating encapsulation, and an another portion of the first antenna is encapsulated in the second portion of the insulating encapsulation. The second antennas are electrically connected to the at least one semiconductor die, wherein a portion of the second antennas is encapsulated in the first portion of the insulating encapsulation, and an another portion of the second antenna is encapsulated in the second portion of the insulating encapsulation.

According to some embodiments, a package structure includes an insulating encapsulation, a first redistribution structure, at least one semiconductor die, first antennas, and second antennas. The first redistribution structure is located on the insulating encapsulation. The at least one semiconductor die is encapsulated in the insulating encapsulation and electrically connected to the first redistribution structure. The first antennas are electrically connected to the at least one semiconductor die, wherein a first group of the first antennas is encapsulated in the insulating encapsulation, and a second group of the first antennas is located in the first redistribution structure. The second antennas are electrically connected to the at least one semiconductor die, wherein a first group of the second antennas is encapsulated in the insulating encapsulation, and a second group of the second antennas is located in the first redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an insulating encapsulation comprising a first portion, a second portion and a third portion, wherein the second portion is located between the first portion and the third portion;
at least one semiconductor die encapsulated in the first portion of the insulating encapsulation, wherein the second portion and the third portion are sequentially stacked on the at least one semiconductor die;
at least one first antenna electrically connected to the at least one semiconductor die and encapsulated in the third portion of the insulating encapsulation; and
at least one second antenna electrically connected to the at least one semiconductor die and encapsulated in the second portion of the insulating encapsulation.

2. The package structure of claim 1,
wherein the at least one first antenna generates an electromagnetic wave propagating along a first direction, and the at least one first antenna comprises a first reflector, a pair of first drivers and at least one first director, wherein the first reflector, the pair of the first drivers and the at least one first director are sequentially arranged along the first direction, and the pair of the first drivers is located between the first reflector and the at least one first director, and
wherein the at least one second antenna generates an electromagnetic wave propagating along a second direction, and the at least one second antenna comprises a second reflector, a pair of second drivers and at least one second director, wherein the second reflector, the pair of the second drivers and the at least one second director are sequentially arranged along the second direction, and the pair of the second drivers is located between the second reflector and the at least one second director, and
wherein the first direction is different from the second direction.

3. The package structure of claim 2, further comprising:
a first isolation layer connecting to the at least one second antenna, wherein the first isolation layer is located between the first portion of the insulating encapsulation and the second portion of the insulating encapsulation; and
a second isolation layer connecting to the at least one first antenna, wherein the second isolation layer is located between the second portion of the insulating encapsulation and the third portion of the insulating encapsulation.

4. The package structure of claim 3, further comprising:
a redistribution structure electrically connected to the at least one semiconductor die; and
through interlayer vias electrically connected to the redistribution structure, wherein the through interlayer vias comprise at least one first through interlayer via encapsulated in the first portion of the insulating encapsulation and at least one second through interlayer via encapsulated in the second portion of the insulating encapsulation, wherein two opposite ends of the at least one first through interlayer via are respectively connected to the first isolation layer and the redistribution structure, and two opposite ends of the at least one second through interlayer via are respectively connected to the first isolation layer and the second isolation layer.

5. The package structure of claim 1,
wherein the at least one first antenna comprises:
at least one first antenna component generating an electromagnetic wave propagating along a first direction, wherein the at least one first antenna component comprises a first reflector, a pair of first drivers and at least one first director, wherein the first reflector, the pair of the first drivers and the at least one first director are sequentially arranged along the first direction, and the pair of the first drivers is located between the first reflector and the at least one first director; and
at least one second antenna component generating an electromagnetic wave propagating along a second direction, wherein the at least one second antenna component comprises a second reflector, a pair of second drivers, at least one second director, wherein the second reflector, the pair of the second drivers and the at least one second director are sequentially arranged along the second direction, and the pair of the second drivers is located between the second reflector and the at least one second director,
wherein the at least one second antenna comprises:
at least one third antenna component generating an electromagnetic wave propagating along a third direction, wherein the at least one third antenna component comprises a third reflector, a pair of third drivers, and at least one third director, wherein the third reflector, the pair of the third drivers and the at least one third director are sequentially arranged along the third direction, and the pair of the third drivers is located between the third reflector and the at least one third director;
at least one fourth antenna component generating an electromagnetic wave propagating along a fourth direction, wherein the at least one fourth antenna component comprises a fourth reflector, a pair of fourth drivers, and at least one fourth director, wherein the fourth reflector, the pair of the fourth drivers and the at least one fourth director are sequentially arranged along the fourth direction, and the pair of the fourth drivers is located between the fourth reflector and the at least one fourth director; and
at least one fifth antenna component generating an electromagnetic wave propagating along a fifth direction, wherein the at least one fifth antenna component comprises a fifth reflector, a pair of fifth drivers, and at least one fifth director, wherein the fifth reflector, the pair of the fifth drivers and the at least one fifth director are sequentially arranged along the fifth direction, and the pair of the fifth drivers is located between the fifth reflector and the at least one fifth director,
wherein the first direction, the second direction, the third direction, the fourth direction and the fifth direction are different from one another.

6. The package structure of claim 5, wherein the first direction is substantially perpendicular to the second direction, and the fifth direction is substantially perpendicular to the third direction and fourth direction.

7. The package structure of claim 5, further comprising:
a first isolation layer connecting to the at least one third antenna component, the at least one fourth antenna component and the at least one fifth antenna component, wherein the first isolation layer is located between the first portion of the insulating encapsulation and the second portion of the insulating encapsulation; and
a second isolation layer connecting to the at least one first antenna component and the at least one second antenna component, wherein the second isolation layer is located between the second portion of the insulating encapsulation and the third portion of the insulating encapsulation.

8. The package structure of claim 7, further comprising:
a redistribution structure electrically connected to the at least one semiconductor die; and
through interlayer vias electrically connected to the redistribution structure, wherein the through interlayer vias comprises at least one first through interlayer via encapsulated in the first portion of the insulating encapsulation and at least one second through interlayer via encapsulated in the second portion of the insulating encapsulation, wherein two ends of the at least one first through interlayer via are respectively connected to the first isolation layer and the redistribution structure, and two ends of the at least one second through interlayer via are respectively connected to the first isolation layer and the second isolation layer.

9. A package structure, comprising:
an insulating encapsulation comprising a first portion and a second portion stacked on the first portion;
at least one semiconductor die encapsulated in the first portion of the insulating encapsulation;
first antennas electrically connected to the at least one semiconductor die, wherein a portion of each of the first antennas is encapsulated in the first portion of the insulating encapsulation, and another portion of each of the first antennas is encapsulated in the second portion of the insulating encapsulation; and
second antennas electrically connected to the at least one semiconductor die, wherein a portion of each of the second antennas is encapsulated in the first portion of the insulating encapsulation, and another portion of each of the second antennas is encapsulated in the second portion of the insulating encapsulation.

10. The package structure of claim 9,
wherein each of the first antennas comprises a first reflector, a pair of first drivers and at least one first director, the portion of the first antennas generates an electromagnetic wave propagating along a first direction, and the another portion of the first antennas generates an electromagnetic wave propagating along an opposite direction of the first direction, wherein for each of the portion of the first antennas, the first reflector, the pair of the first drivers and the at least one first director are sequentially arranged along the first direction, and the pair of the first drivers is located between the first reflector and the at least one first director, and wherein for each of the another portion of the first antennas, the first reflector, the pair of the first drivers and the at least one first director are sequentially arranged along the opposite direction of the first direction, and the pair of the first drivers is located between the first reflector and the at least one first director, and
wherein each of the second antennas comprise a second reflector, a pair of second drivers and at least one second director, the portion of the second antennas generate an electromagnetic wave propagating along a second direction, and another portion of the second antennas generate an electromagnetic wave propagating along an opposite direction of the second direction, wherein for each of the portion of the second antennas, the second reflector, the pair of the second drivers and the at least one second director are sequentially arranged along the second direction, and the pair of the second drivers is located between the second reflector and the at least one second director, and wherein for each of the another portion of the second antennas, the second reflector, the pair of the second drivers and the at least one second director are sequentially arranged along the opposite direction of the second direction, and the pair of the second drivers is located between the second reflector and the at least one second director, and wherein the first direction is different from the second direction.

11. The package structure of claim 9, further comprising:
an isolation layer connecting to the another portion of the first antennas and the another portion of the second antennas, wherein the isolation layer is located between the first portion of the insulating encapsulation and the second portion of the insulating encapsulation.

12. The package structure of claim 11, further comprising:
a redistribution structure electrically connected to the at least one semiconductor die; and
at least one through interlayer via electrically connected to the redistribution structure, wherein the at least one through interlayer via is encapsulated in the first portion of the insulating encapsulation, and two ends of the at least one through interlayer via are respectively connected to the isolation layer and the redistribution structure.

13. The package structure of claim 9, further comprising:
a first through interlayer via wall encapsulated in the first portion of the insulating encapsulation, wherein the first through interlayer via wall is electrically connected to one of the first antennas through the first reflector and electrically connected to one of the second antennas through the second reflector; and
a second through interlayer via wall encapsulated in the second portion of the insulating encapsulation, wherein the second through interlayer via wall is electrically connected to one of the first antennas through the first reflector and electrically connected to one of the second antennas through the second reflector.

14. A package structure, comprising:
an insulating encapsulation;
a first redistribution structure located on the insulating encapsulation;
at least one semiconductor die encapsulated in the insulating encapsulation and electrically connected to the first redistribution structure;
first antennas electrically connected to the at least one semiconductor die, wherein a first group of the first antennas is encapsulated in the insulating encapsulation and a second group of the first antennas is located in the first redistribution structure; and
second antennas electrically connected to the at least one semiconductor die, wherein a first group of the second antennas is encapsulated in the insulating encapsulation and a second group of the second antennas is located in the first redistribution structure.

15. The package structure of claim 14,
wherein the first antennas generate an electromagnetic wave propagating along a first direction, and each of the first antennas comprises a first reflector, a pair of first drivers, and at least one first director, wherein the first reflector, the pair of the first drivers, and the at least one first director are sequentially arranged along the first direction, and the pair of the first drivers is located between the first reflector and the at least one first director, and wherein the second antennas generate an electromagnetic wave propagating along a second direction, and each of the second antennas comprises a second reflector, a pair of second drivers, and at least one second director, wherein the second reflector, the pair of the second drivers, and the at least one second director are sequentially arranged along the second direction, and the pair of the second drivers is located between the second reflector and the at least one second director, and wherein the first direction is different from the second direction.

16. The package structure of claim 14, wherein the first redistribution structure further comprises an isolation layer, wherein the isolation layer is connected to the second group of the first antennas through the first reflector and connected to the second group of the second antennas through the second reflector.

17. The package structure of claim 16, further comprising:
a second redistribution structure electrically connected to the at least one semiconductor die, wherein the insulating encapsulation is located between the first redistribution structure and the second redistribution structure; and
at least one through interlayer via encapsulated in the insulating encapsulation, wherein two ends of the at least one through interlayer via are respectively connected to the isolation layer of the first redistribution structure and the second redistribution structure.

18. The package structure of claim 14, wherein the first group of the first antennas and the first group of the second antennas are vertical polarized antennas, and the second group of the first antennas and the second group of the second antennas are horizontal polarized antennas.

19. The package structure of claim 14, further comprising third antennas above the first redistribution structure, wherein the third antennas are electrically coupled to the isolation layer of the first redistribution structure and arranged in a form of an array, and the first redistribution structure is located between the third antennas and the insulating encapsulation.

20. The package structure of claim 19, further comprising a dielectric layer between the third antennas and the first redistribution structure, and the first redistribution structure is located between the dielectric layer and the insulating encapsulation.

* * * * *